United States Patent
Lee et al.

(10) Patent No.: US 12,372,402 B2
(45) Date of Patent: Jul. 29, 2025

(54) SPECTRAL FILTER, AND IMAGE SENSOR AND ELECTRONIC DEVICE INCLUDING THE SPECTRAL FILTER

(71) Applicant: SAMSUNG ELECTRONICS CO., LTD., Suwon-si (KR)

(72) Inventors: Jaesoong Lee, Suwon-si (KR); Hyochul Kim, Yongin-si (KR); Yeonsang Park, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 818 days.

(21) Appl. No.: 17/506,293

(22) Filed: Oct. 20, 2021

(65) Prior Publication Data
US 2022/0128407 A1    Apr. 28, 2022

(30) Foreign Application Priority Data

Oct. 27, 2020  (KR) .................. 10-2020-0140695
Jul. 13, 2021  (KR) .................. 10-2021-0091682

(51) Int. Cl.
*G01J 3/26* (2006.01)
*G01J 3/18* (2006.01)
*G01J 3/28* (2006.01)

(52) U.S. Cl.
CPC .............. *G01J 3/26* (2013.01); *G01J 3/1895* (2013.01); *G01J 3/2823* (2013.01)

(58) Field of Classification Search
CPC .......... G01J 3/26; G01J 3/1895; G01J 3/2823; G01J 2003/2806; H01L 27/14621;
(Continued)

(56) References Cited

U.S. PATENT DOCUMENTS 6,535,541 B1 * 3/2003 Boucart .............. H01S 5/18311
                                                          372/50.1
9,130,353 B2 * 9/2015 Lell ......................... H01S 5/323
(Continued)

FOREIGN PATENT DOCUMENTS

CN    105899938 A    8/2016
CN    110783351 A    2/2020
(Continued)

OTHER PUBLICATIONS

Communication dated Jan. 24, 2024, issued by the European Patent Office in European Application No. 21204204.8.
(Continued)

*Primary Examiner* — Seung C Sohn
(74) *Attorney, Agent, or Firm* — Sughrue Mion, PLLC

(57) ABSTRACT

Provided is a spectral filter including a first Bragg reflective layer, a second Bragg reflective layer that is spaced apart from the first Bragg reflective layer and includes a cavity, the first resonance layer being provided between the first Bragg reflective layer and the second Bragg reflective layer, a second resonance layer including at least a portion of the first Bragg reflective layer, the second Bragg reflective layer, and the cavity, a third Bragg reflective layer, a fourth Bragg reflective layer spaced apart from the third Bragg reflective layer, wherein the second resonance layer is provided between the third Bragg reflective layer and the fourth Bragg reflective layer.

26 Claims, 27 Drawing Sheets

(58) Field of Classification Search
CPC .......... G02B 5/201; G02B 5/28; G02B 5/288; H04N 25/71; H04N 23/84; H04N 25/11; H04N 25/76
See application file for complete search history.

(56) References Cited

U.S. PATENT DOCUMENTS

| | | | |
|---|---|---|---|
| 9,816,920 | B2 | 11/2017 | Fix et al. |
| 2016/0111594 | A1* | 4/2016 | Nagel .................... H01L 33/08 257/13 |
| 2018/0170093 | A1 | 6/2018 | Najiminaini et al. |
| 2018/0335557 | A1 | 11/2018 | Ockenfuss |
| 2020/0109991 | A1 | 4/2020 | Tack et al. |
| 2021/0148757 | A1 | 5/2021 | Kim et al. |
| 2021/0265408 | A1 | 8/2021 | Huang et al. |
| 2021/0288097 | A1 | 9/2021 | Kim et al. |
| 2021/0318477 | A1 | 10/2021 | Kim et al. |
| 2022/0342130 | A1 | 10/2022 | Kim et al. |

FOREIGN PATENT DOCUMENTS

| | | |
|---|---|---|
| EP | 0902305 A1 | 3/1999 |
| KR | 10-2019-0106646 A | 9/2019 |
| KR | 10-2020-0038149 A | 4/2020 |
| KR | 10-2020-0116393 A | 10/2020 |
| KR | 10-2022-0146318 A | 11/2022 |
| WO | 03/038482 A2 | 5/2003 |

OTHER PUBLICATIONS

Communication issued by the European Patent Office dated Mar. 23, 2022 issued in EP Application No. 21204204.8.
Communication issued on Apr. 10, 2025 by the European Patent Office in European Patent Application No. 21204204.8.

\* cited by examiner

FIG. 15

|  |  |  |  | ,1030 |
|---|---|---|---|---|
| F1 (UV1) | F6 (B1) | F11 (B4) | F16 (G4) | F21 (G6) |
| F2 (UV2) | F7 (B2) | F12 (B5) | F17 (G5) | F22 (G7) |
| F3 (UV3) | F8 (B3) | F13 (R2) | F18 (R5) | F23 (NIR2) |
| F4 (G1) | F9 (G3) | F14 (R3) | F19 (R6) | F24 (NIR3) |
| F5 (G2) | F10 (R1) | F15 (R4) | F20 (NIR1) | F25 (NIR4) |

SPECTRAL FILTER, AND IMAGE SENSOR AND ELECTRONIC DEVICE INCLUDING THE SPECTRAL FILTER

CROSS-REFERENCE TO RELATED APPLICATION

This application is based on and claims priority under 35 U.S.C. § 119 to Korean Patent Application No. 10-2020-0140695, filed on Oct. 27, 2020, and Korean Patent Application No. 10-2021-00 91682, filed on Jul. 13, 2021, in the Korean Intellectual Property Office, the disclosures of which are incorporated by reference herein in their entireties.

BACKGROUND

1. Field

Example embodiments of the present disclosure relate to a spectral filter, and an image sensor and an electronic device including the spectral filter.

2. Description of Related Art

Image sensors using spectral filters are one of important optical instruments in the field of optics. Image sensors according to related art, including various optical devices, may be bulky and heavy. Recently, according to the demand for miniaturization of image sensors, research has been conducted to simultaneously implement an integrated circuit and an optical element on a single semiconductor chip.

SUMMARY

Example embodiments provide a spectral filter, and an image sensor and an electronic device including the spectral filter Additional aspects will be set forth in part in the description which follows and, in part, will be apparent from the description, or may be learned by practice of example embodiments of the disclosure.

According to an aspect of an example embodiment, there is provided a spectral filter including a first Bragg reflective layer, a second Bragg reflective layer that is spaced apart from the first Bragg reflective layer, a first resonance layer including a cavity, the first resonance layer being provided between the first Bragg reflective layer and the second Bragg reflective layer, a second resonance layer including at least a portion of the first Bragg reflective layer, the second Bragg reflective layer, and the cavity, a third Bragg reflective layer, a fourth Bragg reflective layer spaced apart from the third Bragg reflective layer, wherein the second resonance layer is provided between the third Bragg reflective layer and the fourth Bragg reflective layer.

Each of the first Bragg reflective layer, the second Bragg reflective layer, the third Bragg reflective layer, and the fourth Bragg reflective layer may include a plurality of material layers having different refractive indices that are alternately stacked.

Each of the first Bragg reflective layer, the second Bragg reflective layer, the third Bragg reflective layer, and the fourth Bragg reflective layer may include a distributed Bragg reflector (DBR).

The first Bragg reflective layer and the second Bragg reflective layer may be symmetrical with respect to the first resonance layer.

The third Bragg reflective layer and the fourth Bragg reflective layer may be symmetrical with respect to the second resonance layer.

A thickness of a material layer included in the first Bragg reflective layer and the second Bragg reflective layer may be different from a thickness of a material layer included in the third Bragg reflective layer and fourth Bragg reflective layer.

A thickness of a material layer included in the first Bragg reflective layer and the second Bragg reflective layer may be less than a thickness of a material layer included in the third Bragg reflective layer and the fourth Bragg reflective layer.

The second resonance layer may include the first Bragg reflective layer and the second Bragg reflective layer.

A first surface of the first Bragg reflective layer and a first surface of the second Bragg reflective layer may be in contact with the first resonance layer.

A second surface of the first Bragg reflective layer opposite to the first surface of the first Bragg reflective layer and a second surface of the second Bragg reflective opposite to the first surface of the second Bragg reflective layer may be in contact with the third Bragg reflective layer and the fourth Bragg reflective layer, respectively.

The second resonance layer may include one of the first Bragg reflective layer and the second Bragg reflective layer.

One of the first Bragg reflective layer and the second Bragg reflective layer may be in contact with the first resonance layer.

The other one of the first Bragg reflective layer and second Bragg reflective layer may be spaced apart from the first resonance layer, and one of the third Bragg reflective layer and the fourth Bragg reflective layer may be provided between the other of the first Bragg reflective layer and second Bragg reflective layer and the first resonance layer.

A wavelength of light passing through the spectral filter may be determined by at least one of an effective refractive index of the cavity and a thickness of the cavity.

The spectral filter may further include a first unit filter configured to transmit light of a first wavelength, and a second unit filter configured to transmit light of a second wavelength that is different from the first wavelength.

An effective refractive index of the cavity included in a first unit filter and an effective refractive index of the cavity included in a second unit filter may be different from each other.

A material pattern of the cavity included in a first unit filter and a material pattern of the cavity included in a second unit filter may be different from each other.

According to another aspect of an example embodiment, there is provided an image sensor including a spectral filter configured to transmit light, and a pixel array configured to receive the light transmitted through the spectral filter, wherein the spectral filter may include a first Bragg reflective layer, a second Bragg reflective layer spaced apart from the first Bragg reflective layer, a first resonance layer including a cavity, the first resonance layer being provided between the first Bragg reflective layer and the second Bragg reflective layer, a second resonance layer including at least a portion of the first Bragg reflective layer, the second Bragg reflective layer, and the cavity, and a third Bragg reflective layer, a fourth Bragg reflective layer spaced apart from the third Bragg reflective layer, wherein the second resonance layer is provided between the third Bragg reflective layer and the fourth Bragg reflective layer.

Each of the first Bragg reflective layer, the second Bragg reflective layer, the third Bragg reflective layer, and the fourth Bragg reflective layer may include a distributed Bragg reflector (DBR).

A thickness of a material layer included in the first Bragg reflective layer and the second Bragg reflective layer may be different from a thickness of a material layer included in the third Bragg reflective layer and the fourth Bragg reflective layer.

The second resonance layer may include the first Bragg reflective layer and the second Bragg reflective layer.

A first surface of the first Bragg reflective layer and a first surface of the second Bragg reflective layer may be in contact with the first resonance layer, and a second surface of the first Bragg reflective layer opposite to the first surface of the first Bragg reflective layer and a second surface of the second Bragg reflective layer opposite to the first surface of the second Bragg reflective layer may be in contact with the third Bragg reflective layer and the fourth Bragg reflective layer, respectively.

The second resonance layer may include one of the first Bragg reflective layer and the second Bragg reflective layer.

One of the first Bragg reflective layer and the second Bragg reflective layer may be in contact with the first resonance layer.

According to yet another aspect of an example embodiment, there is provided an electronic device including an image sensor, the image sensor including a spectral filter configured to transmit light, and a pixel array configured to receive the light transmitted through the spectral filter, wherein the spectral filter may include a first Bragg reflective layer, a second Bragg reflective layer spaced apart from the first Bragg reflective layer, a first resonance layer including a cavity, the first resonance layer being provided between the first Bragg reflective layer and the second Bragg reflective layer, a second resonance layer including at least a portion of the first Bragg reflective layer, the second Bragg reflective layer, and the cavity, and a third Bragg reflective layer, a fourth Bragg reflective layer spaced apart from the third Bragg reflective layer, wherein the second resonance layer is provided between the third Bragg reflective layer and the fourth Bragg reflective layer.

The electronic device may include one of a mobile phone, a smartphone, a tablet, a smart tablet, a digital camera, a camcorder, a notebook computer, a television, a smart television, a smart refrigerator, a security camera, a robot, or a medical camera.

According to yet another aspect of an example embodiment, there is provided a spectral filter including a first Bragg reflective layer having a first thickness, a second Bragg reflective layer that is spaced apart from the first Bragg reflective layer and having the first thickness, a first resonance layer including a cavity, the first resonance layer being provided between the first Bragg reflective layer and the second Bragg reflective layer, a second resonance layer including at least a portion of the first Bragg reflective layer, the second Bragg reflective layer, and the cavity, a third Bragg reflective layer having a second thickness, a fourth Bragg reflective layer spaced apart from the third Bragg reflective layer and having the second thickness, wherein the second resonance layer is provided between the third Bragg reflective layer and the fourth Bragg reflective layer, and wherein the first thickness is different from the second thickness.

BRIEF DESCRIPTION OF THE DRAWINGS

The above and/or other aspects, features, and advantages of certain example embodiments of the disclosure will be more apparent from the following description taken in conjunction with the accompanying drawings, in which:

FIG. 15 is a plan view of another example of a spectral filter that is applicable to the image sensor of FIG. 1;

DETAILED DESCRIPTION

Figure 1:
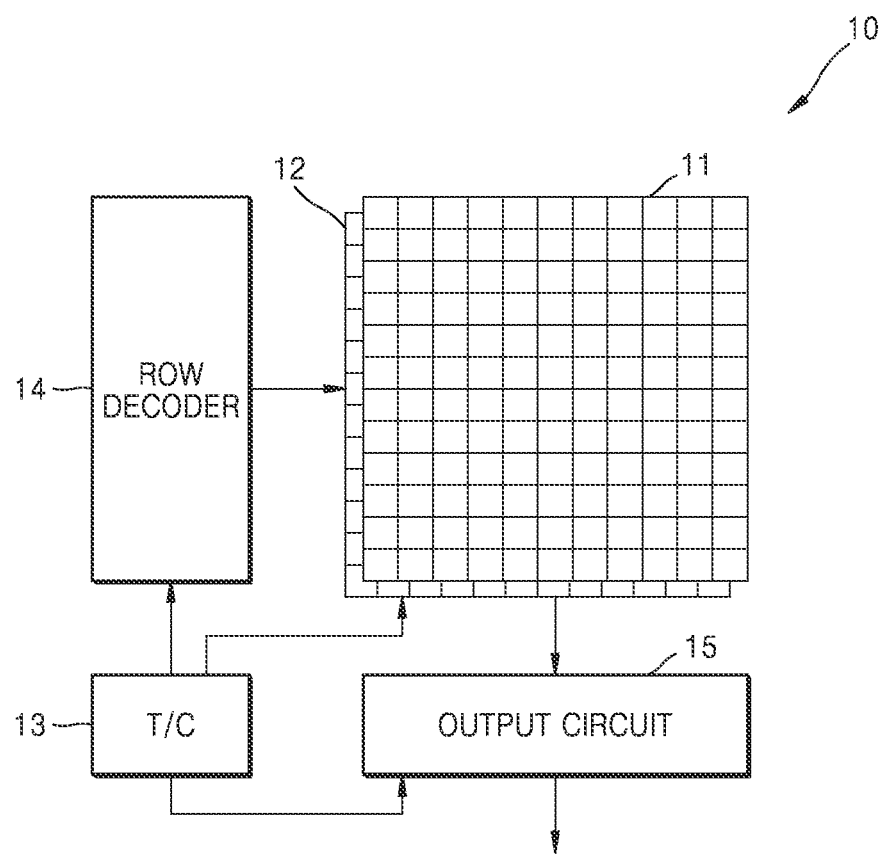
FIG. 1 is a perspective view schematically showing a spectrometer according to an example embodiment.

Example embodiments will now be described in detail with reference to the accompanying drawings, wherein like reference numerals refer to like elements throughout. In this regard, the example embodiments may have different forms and should not be construed as being limited to the descriptions set forth herein. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, example embodiments will be described in detail with reference to the accompanying drawings. In the following drawings, the same reference numerals refer to the same components, and the size of each component in the drawings may be exaggerated for clarity and convenience of description. Further, the example embodiments described below are merely exemplary, and various modifications are possible from these example embodiments.

Hereinafter, what is described as "upper part" or "on" may include not only those directly above by contact, but also those above non-contact. The terms of a singular form may include plural forms unless otherwise specified. In addition, when a certain part "includes" a certain component, it means that other components may be further included rather than excluding other components unless otherwise stated.

The use of the term "the" and similar designating terms may correspond to both the singular and the plural. If there is no explicit order or contradictory statement about the steps constituting the method, these steps may be performed in an appropriate order, and are not necessarily limited to the order described.

In addition, terms such as "unit" and "module" described in the specification mean a unit that processes at least one function or operation, and this may be implemented as hardware or software, or may be implemented as a combination of hardware and software.

The connection or connection members of lines between the components shown in the drawings are illustrative of functional connections and/or physical or circuit connections, and may be represented as a variety of functional connections, physical connections, or circuit connections that are replaceable or additional in an actual device.

The use of all examples or illustrative terms is merely for describing technical ideas in detail, and the scope is not limited by these examples or illustrative terms unless limited by the claims.

FIG. 1 is a schematic block diagram of an image sensor 10 according to an example embodiment.

Referring to FIG. 1, the image sensor 1000 may include a spectral filter 11, a pixel array 12, a timing controller 13, a row decoder 14, and an output circuit 15. The image sensor 10 may include a charge coupled device (CCD) image sensor or a complementary metal oxide semiconductor (CMOS) image sensor, but embodiments are not limited thereto.

The spectral filter 11 may include a plurality of unit filters that transmit light of different wavelength ranges and are arranged in two dimensions. The pixel array 12 may include a plurality of pixels that detect light of different wavelengths that transmitted through the unit filters. For example, the pixel array 12 may include pixels arranged in two dimensions along a plurality of rows and columns. The row decoder 14 may select one of the rows of the pixel array 12 in response to a row address signal output from the timing controller 13. The output circuit 15 may output a light detection signal in units of columns from the pixels arranged in a selected row. To this end, the output circuit 15 may include a column decoder and an analog to digital converter (ADC). For example, the output circuit 15 may include a plurality of ADCs arranged for each column between the column decoder and the pixel array 12, or a single ADC arranged at an output end of the column decoder. The timing controller 13, the row decoder 14, and the output circuit 15 may be implemented by a single chip or separate chips. A processor for processing an image signal output through the output circuit 15 may be implemented by a single chip with the timing controller 13, the row decoder 14, and the output circuit 15, but embodiments are not limited thereto. The pixel array 12 may include a plurality of pixels that detect light of different wavelengths, and the pixels may be arranged in various methods.

Figure 2:
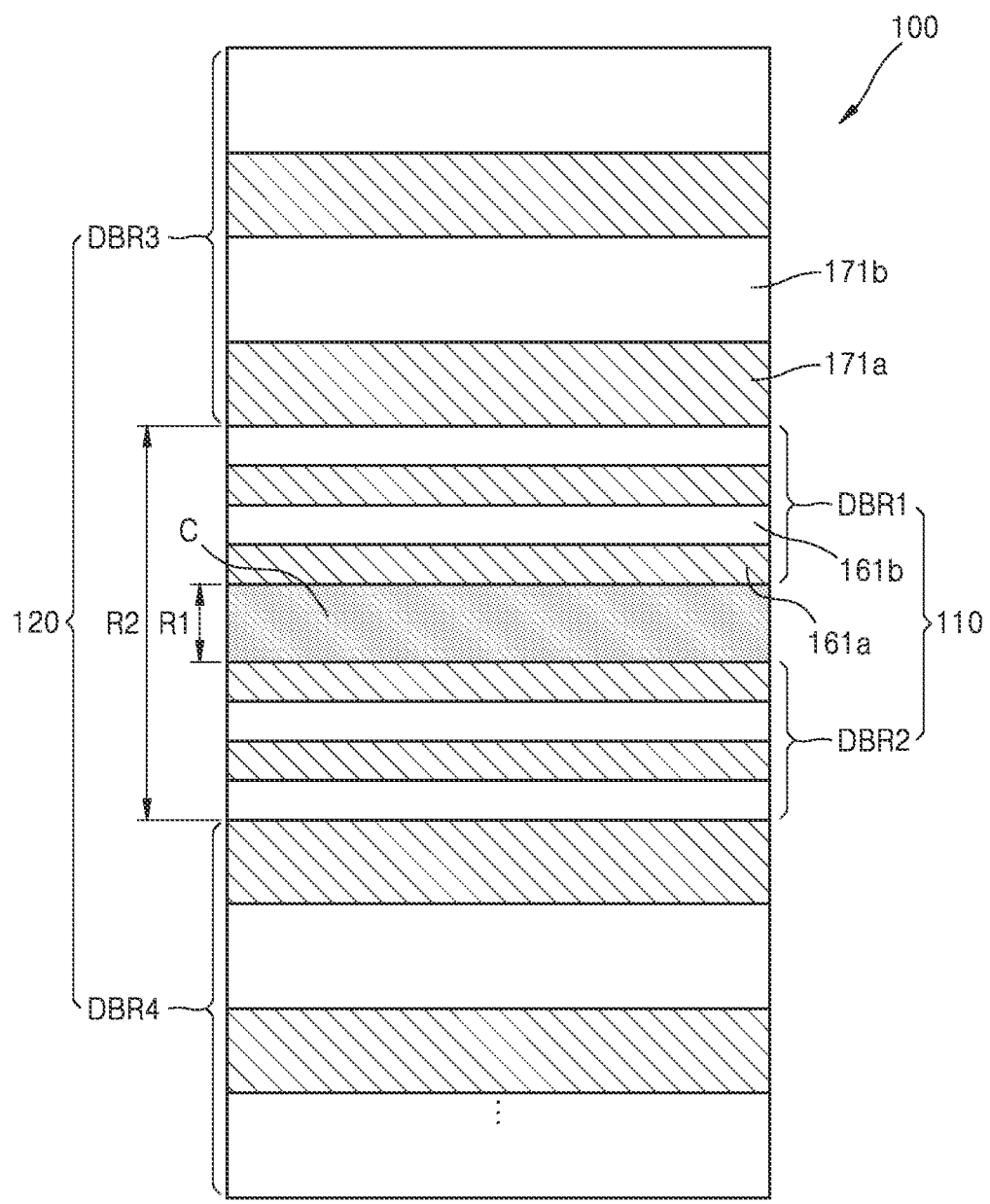
FIG. 2 is a cross-sectional view showing an unit filter included in a spectral filter shown in FIG. 1.

In the following description, the spectral filter 11 of the image sensor 10 is described in detail. FIG. 2 is a cross-sectional view of a spectral filter included in the spectrometer of FIG. 1.

FIG. 2 is a cross-sectional view showing an unit filter included in the spectral filter shown in FIG. 1.

An unit filter 100 may include a cavity C and a first band filter 110 and a second band filter 120 including the cavity C. The first and second band filters 110 and 120 may share the cavity C to transmit light having a specific wavelength determined in the cavity C and block light having a wavelength different from the specific wavelength.

Each of the first and second band filters 110 and 120 transmits light having a specific center wavelength, and has a Fabry-Perot structure in which a resonance layer is provided between two reflective layers. For example, a center wavelength and a wavelength band of light passing through the band filter may be determined according to the reflection band of the reflective layers and the characteristics of the resonance layer.

The first and second band filters 110 and 120 may block light of different wavelengths. The unit filter 100 according to an example embodiment includes a plurality of band filters, that is, the first and second band filters 110 and 120, which block light of different wavelength bands while sharing the cavity C, so that light in a broadband may be blocked.

The first band filter 110 may include a first resonance layer R1 including the cavity C, and a first Bragg reflective layer DBR1 and a second Bragg reflective layer DBR2 spaced apart from each other with the first resonance layer R1 therebetween. Each of the first and second Bragg reflective layers DBR1 and DBR2 may be a distributed Bragg reflector (DBR). Each of the first and second Bragg reflective layers DBR1 and DBR2 may have a symmetrical structure with respect to the first resonance layer R1.

The first resonance layer R1 may include only the cavity C and may contact the first and second Bragg reflective layers DBR1 and DBR2. For example, the first Bragg reflective layer DBR1 may contact the upper surface of the cavity C, and the second Bragg reflective layer DBR2 may contact the lower surface of the cavity C.

The cavity C may include a dielectric material having a predetermined refractive index. For example, the cavity C may include silicon (Si), silicon oxide ($SiO_2$), or titanium oxide ($TiO_2$), but embodiments are not limited thereto.

The effective refractive index of the cavity C may include a material having a refractive index lower than a refractive index of the first and second Bragg reflective layers DBR1 and DBR2. For example, the cavity C may be made of $SiO_2$ (refractive index=1.46). However, this is merely an example, and the cavity C may be made of various materials according to design conditions such as a wavelength of incident light.

Each of the first and second Bragg reflective layers DBR1 and DBR2 may have a structure in which a first material layer 161a and a second material layer 161b having predetermined thicknesses and having different refractive indices are alternately stacked. However, embodiments are not limited thereto, and the first and second Bragg reflective layers DBR1 and DBR2 may have a structure in which three or more material layers having different refractive indices are alternately stacked.

Each of the first and second material layers 161a and 161b may include, for example, $SiO_2$ and $TiO_2$. As another example, the first and second material layers 161a and 161b may each include, for example, $SiO_2$ and Si. However, this is merely exemplary, and the first and second material layers 161a and 161b may include various other materials. Si may have a refractive index of about 3.0 or more, $SiO_2$ may have a refractive index of about 1.4 to about 1.5, and TiO$_2$ may have a refractive index of about 1.9 to about 3.0.

When light passes through the first Bragg reflective layer DBR1 and enters the first resonance layer R1, the light reciprocates within the first resonance layer R1 between the first and second Bragg reflective layers DBR1 and DBR2, causing constructive interference and destructive interference in this process. Then, light having a specific center wavelength that satisfies the constructive interference condition is emitted to the outside of the first band filter 110.

Meanwhile, the unit filter 100 according to an example embodiment may further include a second band filter 120 that shares the cavity C of the first band filter 110. Specifically, the second band filter 120 may include a second resonance layer R2 including at least some of the first and second Bragg reflective layers DBR1 and DBR2 and a cavity C, and a third Bragg reflective layer DBR3 and a fourth Bragg reflective layer DBR4 spaced apart from each other with the second resonance layer R2 therebetween.

The second resonance layer R2 may include the cavity C of the first band filter 110, and include at least some of the first and second Bragg reflective layers DBR1 and DBR2 of the first band filter 110. For example, as shown in FIG. 2, the second resonance layer R2 may include the cavity C and the first and second Bragg reflective layers DBR1 and DBR2.

Each of the third and fourth Bragg reflective layers DBR3 and DBR4 may be a DBR. The third and fourth Bragg reflective layers DBR3 and DBR4 may have a symmetrical structure with respect to the second resonance layer R2.

Each of the third and fourth Bragg reflective layers DBR3 and DBR4 may have a structure in which a third material layer 171a and a fourth material layer 171b having predetermined thicknesses and having different refractive indices are alternately stacked. However, embodiments are not limited thereto, and the third and fourth Bragg reflective layers DBR3 and DBR4 may have a structure in which three or more material layers having different refractive indices are alternately stacked.

Each of the third and fourth material layers 171a and 171b may include, for example, the same material as the first and second material layers 161a and 161b described above. However, embodiments are not limited thereto, and for example, the third and fourth material layers 171a and 171b may each include SiO$_2$ and TiO$_2$. As another example, the third and fourth material layers 171a and 171b may each include, for example, SiO$_2$ and Si. However, this is merely exemplary, and the third and fourth material layers 171a and 171b may include various other materials.

The second band filter 120 may have a reflection wavelength band different from that of the first band filter 110. For example, the second band filter 120 includes third and fourth material layers 171a and 171b, and at least one of the material and thickness of the third and fourth material layers 171a and 171b may be different from the material and thickness of the first and second material layers 161a and 161b. For example, when the third and fourth material layers 171a and 171b are the same as the first and second material layers 161a and 161b, respectively, the third and fourth material layers 171a and 171b may have different thicknesses from the first and second material layers 161a and 161b, respectively.

However, embodiments are not limited thereto, and the third and fourth material layers 171a and 171b may include a material different from that of the first and second material layers 161a and 161b, respectively. In this case, the third and fourth material layers 171a and 171b may have the same thickness as or different thickness from the first and second material layers 161a and 161b, respectively.

In FIG. 2, as the third and fourth material layers 171a and 171b included in the second band filter 120 have a different thickness from the first and second material layers 161a and 161b included in the first band filter 110, a case of implementing different reflection wavelength bands is illustrated as an example.

As described above, in relation to the unit filter 100, because a plurality of band filters including different reflection wavelength bands share the cavity C, rather than filtering light with a single band filter, the role of blocking a wavelength band corresponding to a side band other than the center wavelength may be further strengthened.

Specifically, when light is incident on the unit filter 100, part of the light reciprocates inside the second band filter 120, that is, the second resonance layer R2 between the third and fourth Bragg reflective layers DBR3 and DBR4 and in this process, constructive interference and destructive interference may occur. In addition, another part of the light reciprocates inside the first band filter 110, that is, the first resonance layer R1 between the first and second Bragg reflective layers DBR1 and DBR2 and in this process, constructive interference and destructive interference may occur. Light having a specific center wavelength that satisfies the constructive interference condition is emitted to the outside of the first band filter 110. Because light causes constructive interference and destructive interference in the second band filter 120 and the first band filter 110, a wavelength band to be filtered may be wider.

Figure 3:
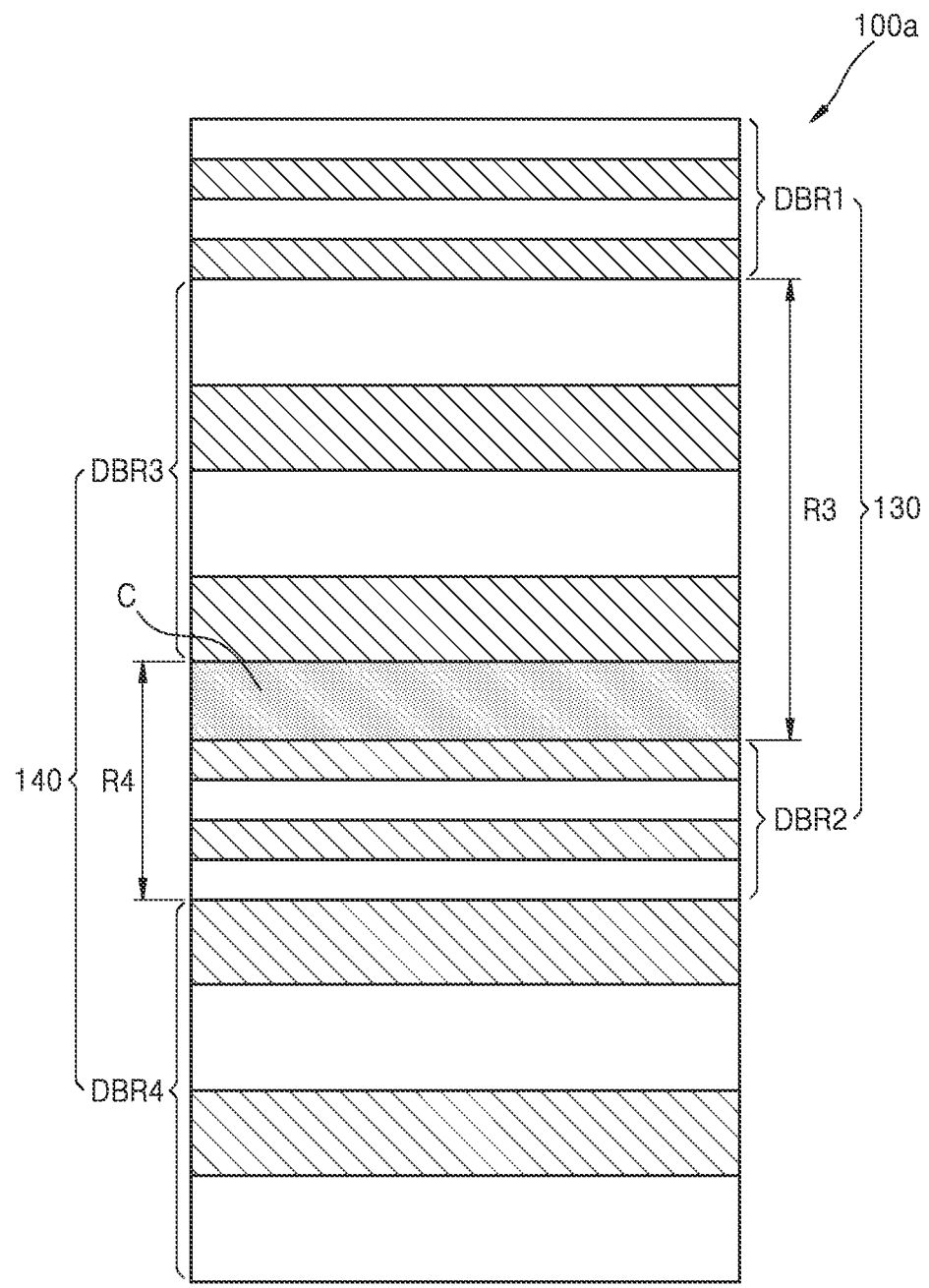
FIG. 3 is a view showing an unit filter according to another example embodiment.

FIG. 3 is a view showing an unit filter according to another example embodiment. As shown in FIG. 3, an unit filter 100a includes a third band filter 130 including a third resonance layer R3 with a cavity C and first and second Bragg reflective layers DBR1 and DBR2 apart from each other with the cavity C therebetween. In addition, the unit filter 100a may further include a fourth band filter 140 including a fourth resonance layer R4 with a part of the first and second Bragg reflective layers DBR1 and DBR2 and the cavity C, and third and fourth Bragg reflective layers DBR3 and DBR4 spaced apart with the fourth resonance layer R4 therebetween.

FIG. 3 illustrates that the third resonance layer R3 includes the cavity C and the third Bragg reflective layer DBR3 and the fourth resonance layer R4 includes the cavity C and the second Bragg reflective layer DBR2. The upper surface of the cavity C may contact the third Bragg reflective layer DBR3, the lower surface of the cavity C may contact the second Bragg reflective layer DBR2, the upper surface of the third Bragg reflective layer DBR3 may contact the first Bragg reflective layer DBR1, and the second Bragg reflective layer DBR2 may contact the fourth Bragg reflective layer DBR4.

The first and second Bragg reflective layers DBR1 and DBR2 may have a symmetrical structure with respect to the third resonance layer R3, and the third and fourth Bragg reflective layers DBR3 and DBR4 may have a symmetrical structure with respect to the fourth resonance layer R4.

Because the unit filter of FIG. 3 also shares the cavity C, the wavelength band to be filtered may increase.

Figure 4:
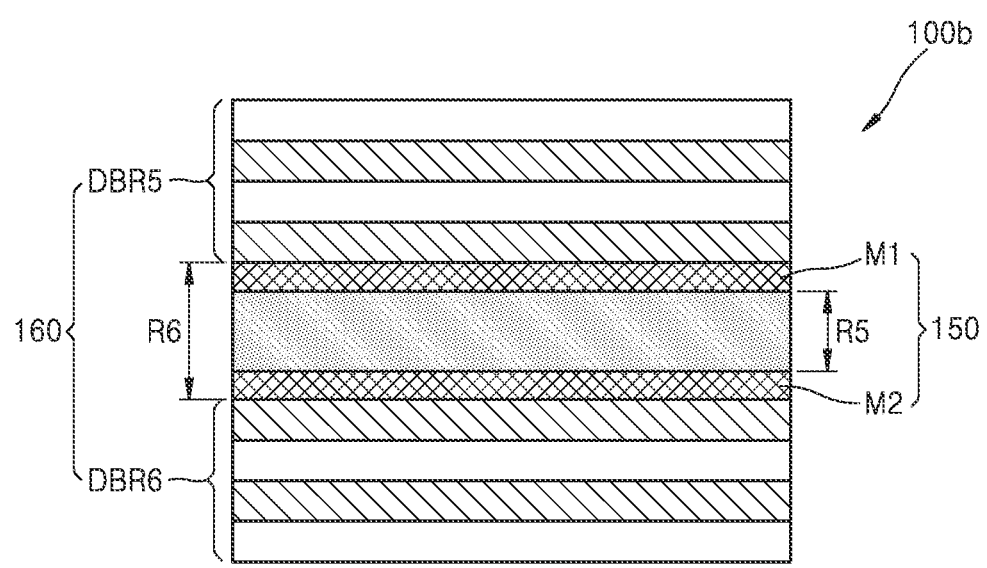
FIG. 4 is a view illustrating a spectral filter according to another example embodiment.
Figure 5:
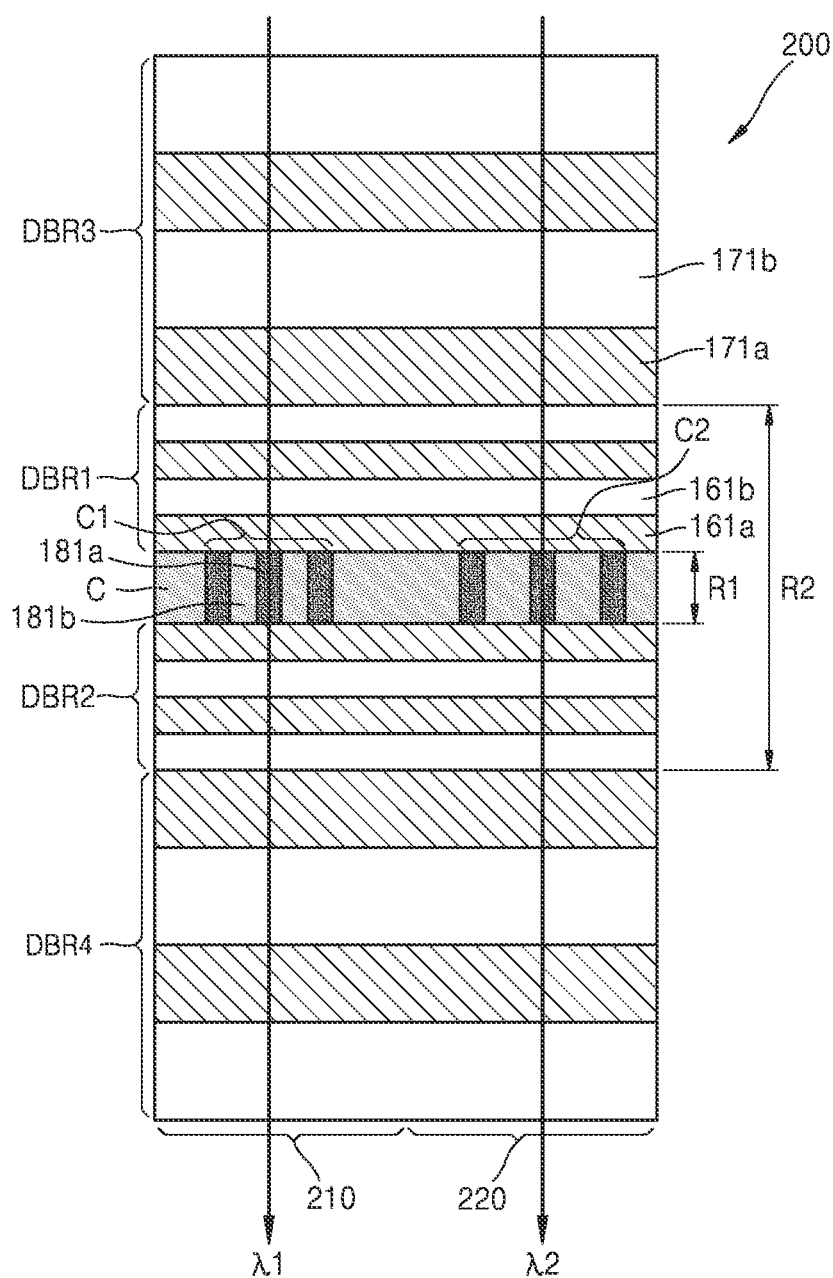
FIG. 5 is a view illustrating a spectral filter that transmits light of different wavelengths according to an example embodiment.

FIG. 4 is a view illustrating a spectral filter according to another example embodiment. As shown in FIG. 5, a unit filter 100b may include a cavity C, a fifth band filter 150 and a sixth band filter 160 including the cavity C. The fifth and sixth band filters 150 and 160 may share the cavity C to transmit light having a specific wavelength determined in the cavity C and block light having a wavelength different from the specific wavelength.

The fifth and sixth band filters 150 and 160 transmit light having a specific center wavelength, and have a Fabry-Perot structure in which a resonance layer is provided between two reflective layers. For example, a center wavelength and a wavelength band of light passing through the band filter may be determined according to the reflection band of the reflective layers and the characteristics of the resonance layer.

The fifth band filter 150 may include a fifth resonance layer R5 including a cavity C and a first metal reflective layer M1 and a second metal reflective layer M2 spaced apart from each other with the fifth resonance layer R5 therebetween.

Each of the first and second metal reflective layers M1 and M2 may include a metal capable of reflecting light in the first wavelength area. For example, the metal may include aluminum (Al), silver (Ag), gold (Au) or titanium nitride (TiN). However, embodiments are not limited thereto. These first and second metal reflective layers M1 and M2 may be provided with a thickness of, for example, about several tens of nm, but embodiments are not limited thereto. For example, the first and second metal reflective layers M1 and M2 may have a thickness of about 10 nm to about 30 nm.

The cavity C provided between the first and second metal reflective layers M1 and M2 may include a dielectric material having a predetermined refractive index as the fifth resonance layer R5. For example, the cavity C may include Si, $SiO_2$, silicon nitride (SiN), hafnium oxide ($HfO_2$), or $TiO_2$. However, embodiments are not limited thereto.

The sixth band filter 160 may include a sixth resonance layer R6 including at least a portion of the fifth band filter 150 and fifth and sixth Bragg reflective layers DBR5 and DBR6 spaced apart from each other with the sixth resonance layer R6 therebetween.

The sixth resonance layer R6 includes the cavity C of the fifth band filter 140, and may include at least some of the first and second metal reflective layers M1 and M2 of the fifth band filter 140. For example, as shown in FIG. 4, the sixth resonance layer R6 may include all of the cavity C and the first and second metal reflective layers M1 and M2.

Each of the fifth and sixth Bragg reflective layers DBR5 and DBR6 may be a DBR. The fifth and sixth Bragg reflective layers DBR5 and DBR6 may have a symmetrical structure with respect to the fourth resonance layer R4.

Each of the fifth and sixth Bragg reflective layers DBR5 and DBR6 may have a structure in which a plurality of material layers having predetermined thicknesses having different refractive indices are alternately stacked. However, embodiments are not limited thereto, and the fifth and sixth Bragg reflective layers DBR5 and DBR6 may have a structure in which three or more material layers having different refractive indices are alternately stacked. The Bragg reflective layer has been described above, and the detailed description thereof will be omitted.

When light enters the spectral filter 100b, some light reciprocates inside the fourth resonance layer R6 between the fifth and sixth Bragg reflective layers DBR5 and DBR6, causing constructive interference and destructive interference in this process, and another light reciprocates inside the fifth resonance layer R5 between the first and second metal reflective layers M1 and M2, causing constructive interface and destructive interference in this process. Then, light having a specific center wavelength that satisfies the constructive interference condition is emitted to the outside of the unit filter 100b. Here, according to the reflection bands of the first and second metal reflective layers M1 and M2, the reflection bands of the fifth and sixth Bragg reflective layers DBR5 and DBR6, and the characteristics of the cavity C, a wavelength band and a center wavelength of light passing through the unit filter 100b may be determined.

In FIG. 4, it has been described that the sixth band filter 160 includes all of the fifth band filters 150, but embodiments are not limited thereto. For example, the sixth band filter 160 may include a partial region of the fifth band filter 150, and the fifth band filter 150 may also include a partial region of the sixth band filter 160. In addition, the fifth band filter 150 may include all of the sixth band filter 160. The structural configuration between the fifth and sixth band filters 150 and 160 may be changed according to the use of the spectral filter.

FIG. 5 is a view illustrating a spectral filter that transmits light of different wavelengths according to an example embodiment. As shown in FIG. 5, a spectral filter 200 may include a first unit filter 210 and a second unit filter 220. Each of the first and second unit filters 210 and 220 may include first to fourth Bragg reflective layers DBR1, DBR2, DBR3, and DBR4 shown in FIG. 2. However, compared with FIG. 2, the cavity C of FIG. 5 may include a first cavity C1 and a second cavity C2 having different effective refractive indices. The effective refractive index may vary according to the arrangement pattern of materials included in the cavity C. The first and second unit filters 210 and 220 may be the same as the first to fourth Bragg reflective layers DBR1, DBR2, DBR3, and DBR4 excluding the effective refractive index of the cavity C.

The cavity C may have a structure in which a fifth material layer 181a and a sixth material layer 181b having different refractive indices are alternately disposed. For example, the fifth material layer 181a may include Si, and the sixth material layer 181b may include $SiO_2$. However, embodiments are not limited thereto, and the fifth and sixth material layers 181a and 181b may include various other materials.

For example, the width of the fifth and sixth material layers 181a and 181b arranged in the first cavity C1 and the width of the fifth and sixth material layers 181a and 181b arranged in the second cavity C2 may be different from each other. Thus, as the effective refractive index of the first cavity C1 is different from the effective refractive index of the second cavity C2, a wavelength of light passing through the first cavity C1 and a wavelength of light passing through the second cavity C2 may be different from each other.

FIG. 5 illustrates an example in which the fifth and sixth material layers 181a and 181b are disposed in a direction perpendicular to the first to fourth Bragg reflective layers DBR1, DBR2, DBR3, and DBR4. However, embodiments are not limited thereto, and the fifth and sixth material layers 181a and 181b may be arranged in a direction parallel to the first to fourth Bragg reflective layers DBR1, DBR2, DBR3, and DBR4, or the fifth and sixth material layers 181a and 181b may be two-dimensionally disposed.

Figure 6:
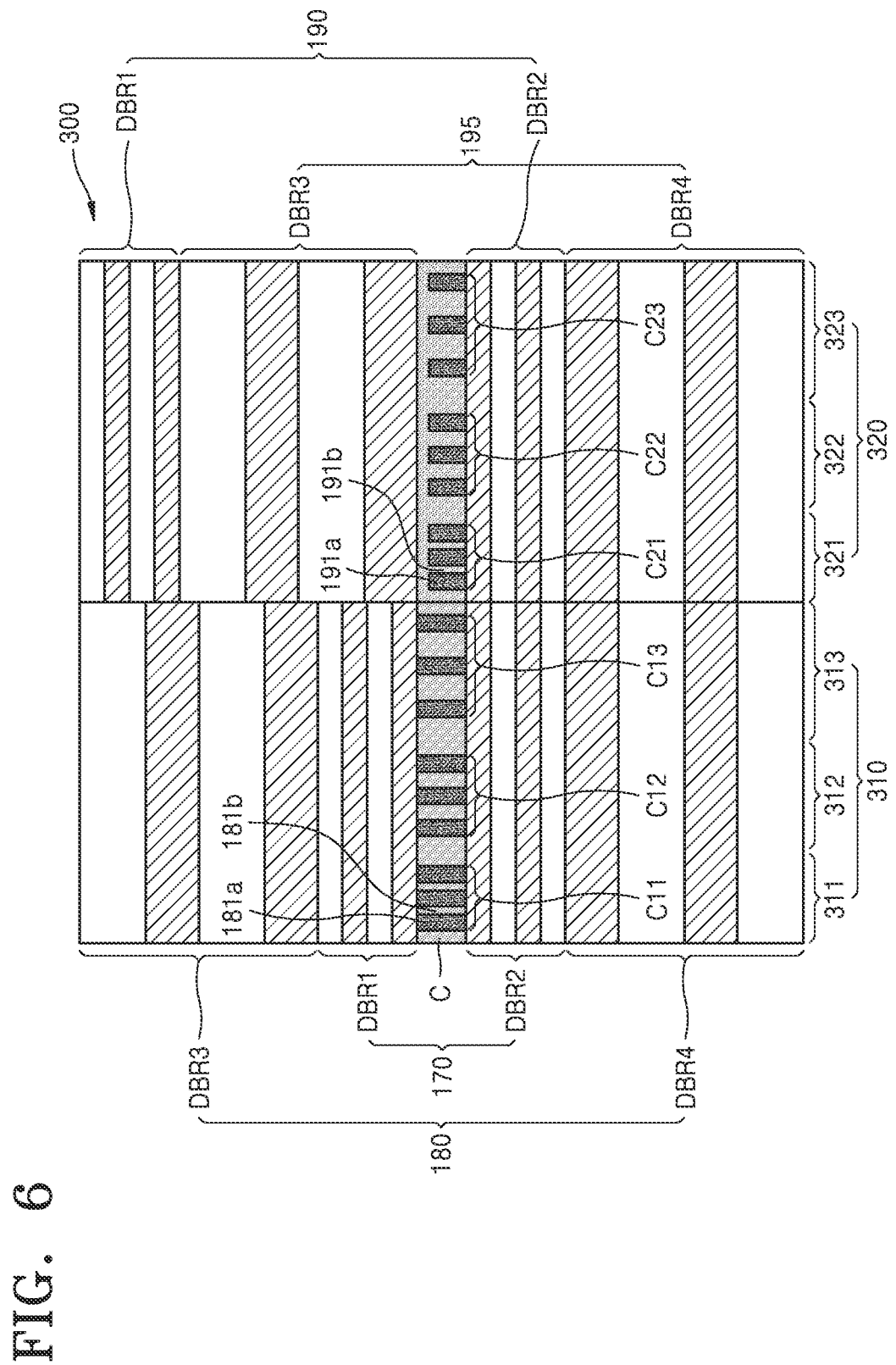
FIG. 6 is a cross-sectional view of a spectral filter according to another example embodiment.

FIG. 6 is a cross-sectional view of a spectral filter according to another example embodiment. Referring to FIG. 6, a spectral filter 300 includes a first filter group 310 and a second filter group 320 disposed on the same plane. The first filter group 310 may include first unit filter 311, a second unit filter 312, and a third unit filter 313, and the second filter group 320 may include fourth unit filer 321, a fifth unit filter 322, and a sixth unit filter 323.

Each of the unit filters 311, 312, and 313 of the first filter group 310 includes a seventh band filter 170 using the cavity C as a resonance layer, and an eighth band filter 180 using the seventh band filter 170 as a resonance layer. For example, the seventh band filter 170 may include a cavity C and first and second Bragg reflective layers DBR1 and DBR2 spaced apart from each other with the cavity C therebetween. The eighth band filter 180 may include third and fourth Bragg reflective layers DBR3 and DBR4 spaced apart from each other with the cavity C and the third and fourth Bragg reflective layers DBR3 and DBR4 therebetween. The first to fourth Bragg reflective layers DBR1, DBR2, DBR3, and DBR4 of the first filter group 310 are the same as the first to fourth Bragg reflective layers DBR1, DBR2, DBR3, and DBR4 shown in FIG. 2, and the detailed description thereof will be omitted.

The first, second, and third unit filters 311, 312, and 313 may include a first cavity C11, a second cavity C12, and a third cavity C13, respectively.

The first cavity C11 may have a structure in which fifth and sixth material layers 181a and 181b having different refractive indices are alternately disposed. For example, the fifth material layer 181a may include Si, and the sixth material layer 181b may include $SiO_2$. However, embodiments not limited thereto, and the first and second material layers 181a and 181b may include various other materials.

FIG. 6 illustrates an example in which the fifth and sixth material layers 181a and 181b are disposed in a direction perpendicular to the first to fourth Bragg reflective layers DBR1, DBR2, DBR3, and DBR4. However, embodiments are not limited thereto, and the fifth and sixth material layers 181a and 181b may be arranged in a direction parallel to the first to fourth Bragg reflective layers DBR1, DBR2, DBR3, and DBR4, or the fifth and sixth material layers 181a and 181b may be two-dimensionally disposed.

The second and third unit filters 312 and 313 of the first filter group 310 are the same as the first unit filter 311 described above except for the effective refractive index of the cavity C. For example, the second cavity C12 of the second unit filter 312 may include fifth and sixth material layers 181a and 181b having a width different from that of the first cavity C11, and the third cavity C13 of the third unit filter 313 may include fifth and sixth material layers 181a and 181b having a thickness different from that of the first and second cavities C11 and C12. Accordingly, the first, second and third cavities C11, C12, and C13 have different effective refractive indices, so that the first to third unit filters 311, 312, and 313 transmit only light of different center wavelengths.

Each of the first to third unit filters 321, 322, and 323 of the second filter group 320 may include a ninth band filter 190 and a tenth band filter 195 that share a cavity C, the ninth band filter 190 may use a part of the tenth band filter 195 as a resonance layer, and the tenth band filter 195 may use a part of the ninth band filter 190 as a resonance layer. For example, the ninth band filter 190 may include a cavity C and first and second Bragg reflective layers DBR1 and DBR2 spaced apart from each other with the cavity C therebetween, and the tenth band filter 195 may include a cavity C and third and fourth Bragg reflective layers DBR3 and DBR4 spaced apart from each other with the cavity C therebetween.

The ninth band filter 190 may utilize any one of the third and fourth Bragg reflective layers DBR3 and DBR4, for example, the third Bragg reflective layer DBR3, and the cavity C as a resonance layer, and the tenth band filter 195 may utilize any one of the first and second Bragg reflective layers DBR1 and DBR2, for example, the second Bragg reflective layer DBR2, and the cavity C as a resonance layer. Thus, the second filter group 320 may be arranged in the order of the first Bragg reflective layer DBR1, the third Bragg reflective layer DBR3, the cavity C, the second Bragg reflective layer DBR2, and the fourth Bragg reflective layer DBR4.

The fourth to sixth unit filters 321, 322, and 323 may include a fourth cavity C21, a fifth cavity C22, and a sixth cavity C23, respectively. The fourth to sixth cavities C21, C22, and C23 may have different effective refractive indices. Each of the fourth to sixth cavities C21, C22, and C23 may include a seventh material layer 191a and at least one eighth material layer 191b disposed inside the seventh material layer 191a and having a refractive index different from that of the seventh material layer 191a.

The case where each of the fourth to sixth cavities C21, C22, and C23 includes a seventh material layer 171a and a plurality of eighth material layers 191b disposed parallel to each other in the seventh material layer 191a is illustrated as an example. Here, each of the seventh and eighth material layers 191a and 191b may include, for example, Si, $SiO_2$, SiN, or $TiO_2$. For example, the seventh material layer 191a may include $SiO_2$, and the second material layer 191b may include $TiO_2$.

The fourth, fifth, and sixth cavities C21, C22, and C23 may change the effective refractive index by adjusting the width of the seventh material layer 191a. FIG. 6 illustrates the case where the seventh material layer 191a is provided such that a width increases from the fourth cavity C21 to the sixth cavity C23. In this case, among the fourth, fifth, and sixth cavities C21, C22, and C23, the sixth cavity C23 may have the largest width and the largest effective refractive index, and the fourth cavity C21 may have the smallest width and the smallest effective refractive index. Among the fourth, fifth, and sixth unit filters 321, 322, and 323, the sixth unit filter 323 may have the longest central wavelength, and the fourth unit filter 321 may have the shortest central wavelength. In addition, depending on the thickness or effective refractive index of the cavity C, some unit filters may have a plurality of center wavelengths.

Figure 7:
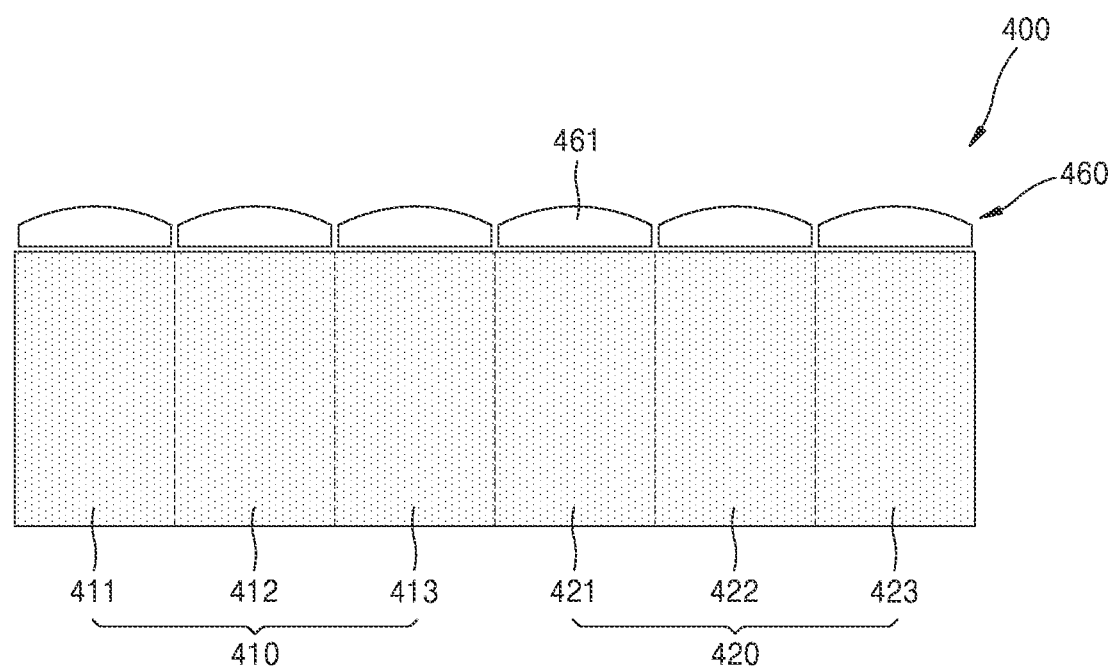
FIG. 7 is a schematic cross-sectional view of a spectral filter according to another example embodiment.

FIG. 7 is a schematic cross-sectional view of a spectral filter according to another example embodiment.

Referring to FIG. 7, a spectral filter 400 includes a first filter array 410 and a second filter array 420 and a micro lens array 460 provided in the first and second filter arrays 410 and 420. The first filter array 410 may include a first unit filter 411, a second unit filter 412, and a third unit filter 413 having a center wavelength in a first wavelength range, and the second filter array 420 may include a fourth unit filter 421, a fifth unit filter 422, and a sixth unit filter 423 having a center wavelength in the second wavelength region.

Any one of the above-described unit filters may be applied to the first to sixth unit filters 411, 412, 413, 421, 422, and 423 included in the first filter array 410. Descriptions of the first and second filter arrays 410 and 420 will be omitted.

The micro lens array 460 including a plurality of micro lenses 461 may be provided above the first and second filter arrays 410 and 420. The micro lens 461 may focus external light on the corresponding first to sixth unit filters 411, 412, 413, 421, 422, and 423 and allow the external light to be incident thereto.

FIG. 7 illustrates an example in which the micro lenses 461 are provided to correspond to the first to sixth unit filters 411, 412, 413, 421, 422 and 423 one-to-one. However, embodiments are not limited thereto. For example, the first to sixth unit filters 411, 412, 413, 421, 422, and 423 may be provided corresponding to one micro lens 461.

Figure 8:
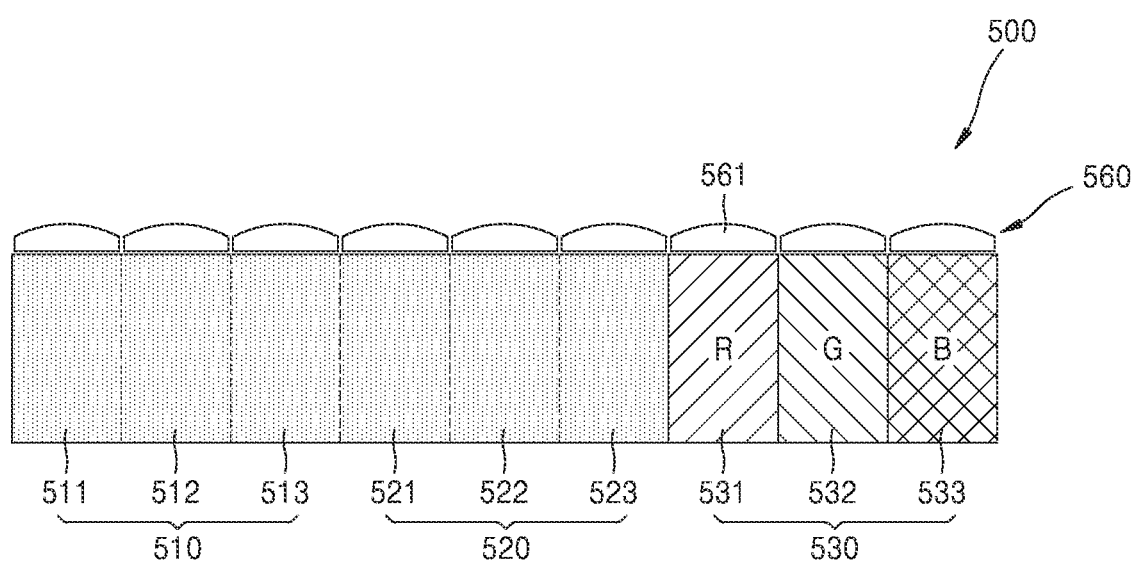
FIG. 8 is a schematic cross-sectional view of a spectral filter according to another example embodiment.

FIG. 8 is a schematic cross-sectional view of a spectral filter according to another example embodiment.

Referring to FIG. 8, a spectral filter 500 includes first filter array 510 and a second filter array 520 and a color filter array 530. Here, the first and second filter arrays 510 and 520 and the color filter array 530 may be provided on substantially the same plane.

The first filter array 510 may include a first unit filter 511, a second unit filter 512, and a third unit filter 513 having a center wavelength in a first wavelength region, and the second filter array 520 may include a fourth unit filter 521, a fifth unit filter 522, and a sixth unit filter 523 having a center wavelength in the second wavelength region. The unit filter described above may be applied to the first to sixth unit filters 511, 512, 513, 521, 522 and 523 included in the first and second filter arrays 510 and 520.

The color filter array 530 may include, for example, a red color filter 531, a green color filter 532, and a blue color filter 533. Here, the red color filter 531 may transmit red light having a wavelength band of about 600 nm to about 700 nm, the green color filter 532 may transmit green light having a wavelength band of about 500 nm to about 600 nm, and the blue color filter 533 may transmit blue light having a wavelength band of about 400 nm to about 500 nm. As the red, green, and blue color filters 531, 532, and 533, for example, a color filter that is applied to a color display device such as a liquid crystal display device or an organic light emitting display device may be used. A micro lens array 560 including a plurality of micro lenses 561 may be further provided above the first and second filter arrays 510 and 520 and the color filter array 530.

According to the example embodiment, information on the center wavelengths of the first to sixth unit filters 511, 512, 513, 521, 522, and 523 may be obtained using the first and second filter arrays 510 and 520, and also information on wavelengths of red, green, and blue light may be additionally obtained using the color filter array 530.

Figure 9:
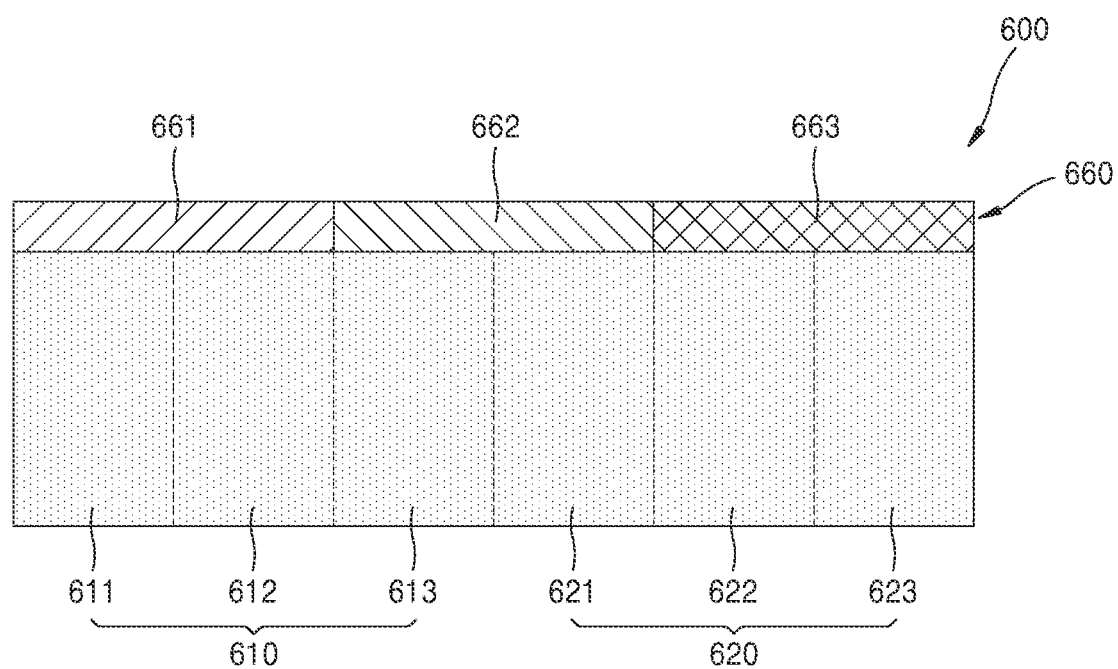
FIG. 9 is a schematic cross-sectional view of a spectral filter according to another example embodiment.

FIG. 9 is a schematic cross-sectional view of a spectral filter according to another example embodiment.

Referring to FIG. 9, a spectral filter 600 includes a first filter array 610 and a second filter array 620 and an additional filter array 660 provided in the first and second filter arrays 610 and 620. The first filter array 610 may include a first unit filter 611, a second unit filter 612, and a third unit filter 613 having a center wavelength in a first wavelength region, and the second filter array 620 may include a fourth unit filter 621, a fifth unit filter 622, and a sixth unit filter 623 having a center wavelength in the second wavelength region.

The unit filters described above may be applied to the unit filters included in the first and second filter arrays 610 and 620 described above, and detailed descriptions will be omitted.

The additional filter array 660 may include a plurality of additional filters, for example, a first additional filter 661, a second additional filter 662, and a third additional filter 663. It is shown in FIG. 9 that the first additional filter 661 is provided corresponding to the first and second unit filters 611 and 612, the second additional filter 662 is provided corresponding to the third and fourth unit filters 613 and 621, and the third additional filter 663 is provided corresponding to the fifth and sixth unit filters 622 and 623. However, embodiments are not limited thereto, and each of the first, second and third additional filters 661, 662, 663 may be provided to correspond to one of the first to sixth unit filters 611, 612, 613, 621, 622, and 623, or may be provided corresponding to three or more of the first to sixth unit filters 611, 612, 613, 621, 622, and 623.

Each of the first, second and third additional filters 661, 662, and 663 may block light in the wavelength band that is not desired by the corresponding first to sixth unit filters 611, 612, 613, 621, 622, and 623. For example, when the first and second unit filters 611 and 612 have center wavelengths in a wavelength band of about 400 nm to about 500 nm, the first additional filter 661 may be a blue filter that transmits blue light. In addition, when the third and fourth unit filters 613 and 621 have center wavelengths in a wavelength band of about 500 nm to about 600 nm, the second additional filter 662 may be a green filter that transmits green light. In addition, when the fifth and sixth unit filters 622 and 623 have a center wavelength in a wavelength band of about 600 nm to about 700 nm, the third additional filter 663 may be a red filter that transmits red light.

The additional filter array 660 may be a color filter array. In this case, the first, second, and third additional filters 661, 662, and 663 may be blue, green, and red color filters, respectively. As the red, green, and blue color filters, for example, a color filter that is applied to a color display device such as a liquid crystal display device or an organic light emitting display device may be used.

The additional filter array 660 may be a broadband filter array. In this case, the first, second, and third additional filters 661, 662, and 663 may be first, second, and third broadband filters, respectively. Here, each of the broadband filters may have, for example, a multi-cavity C structure or a metal mirror structure.

Figure 10:
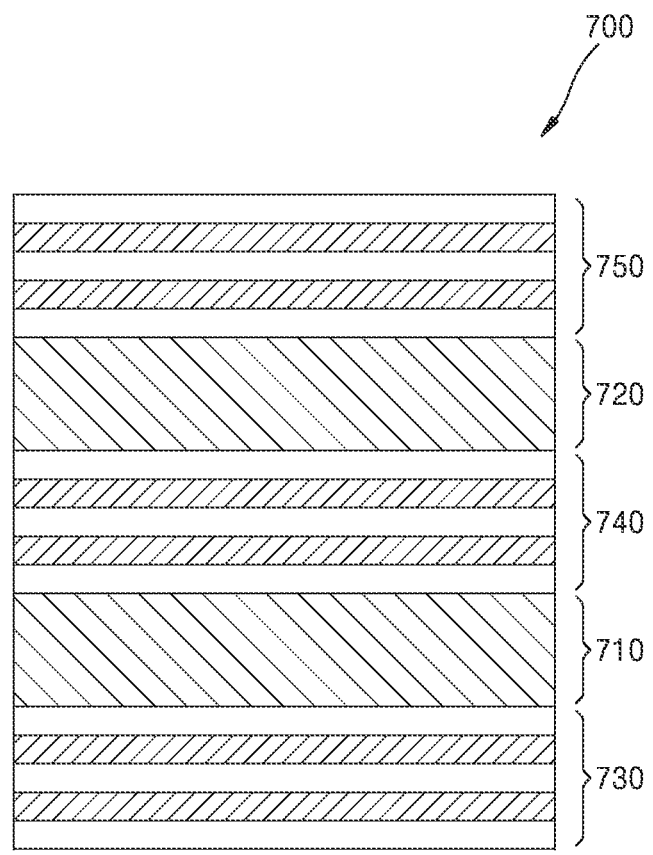
FIG. 10 shows an example of a filter that may be used as an additional filter according to an example embodiment.

FIG. 10 shows an example of a filter that may be used as an additional filter according to an example embodiment.

Referring to FIG. 10, a broadband filter 700 includes a plurality of reflective layers 730, 740, and 750 disposed to be spaced apart from each other, and a plurality of cavities 710 and 720 provided between the reflective layers 730, 740, and 750. In FIG. 10, three reflective layers, that is, the reflective layers 730, 740, and 750, and two cavities, that is, the cavities 710 and 720, are shown as an example, but the number of reflective layers and the number of cavities may be variously modified.

Each of the reflective layers 730, 740, and 750 may be a DBR. Each of the reflective layers 730, 740, and 750 may have a structure in which a plurality of material layers having different refractive indices are alternately stacked. Further, each of the cavities 710 and 720 may include a material having a predetermined refractive index or may include two or more materials having different refractive indices.

Figure 11:
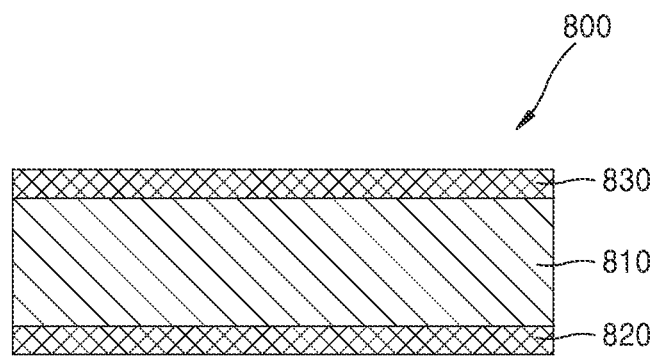
FIG. 11 shows another example of a filter that may be used as an additional filter according to an example embodiment.

FIG. 11 shows another example of a filter that may be used as an additional filter according to another example embodiment.

Referring to FIG. 11, a filter 800 may include two metal reflective layers 820 and 830 disposed to be spaced apart from each other, and a cavity 810 provided between the metal reflective layers 820 and 830. The metal reflective layers 820 and 830 may include a metal such as Al, Ag, Au, or TiN. However, embodiments are not limited thereto. The metal reflective layers 820 and 830 may be provided with a thickness of several tens of nm, but embodiments are not limited thereto. For example, the metal reflective layers 820 and 830 may have a thickness of about 10 nm to about 30 nm.

The cavity 810 provided between the metal reflective layers 820 and 830 may include a dielectric material having a predetermined refractive index. For example, the cavity 810 may include Si, $SiO_2$, SiN, $HfO_2$, or $TiO_2$. However, embodiments are not limited thereto.

Figure 12:
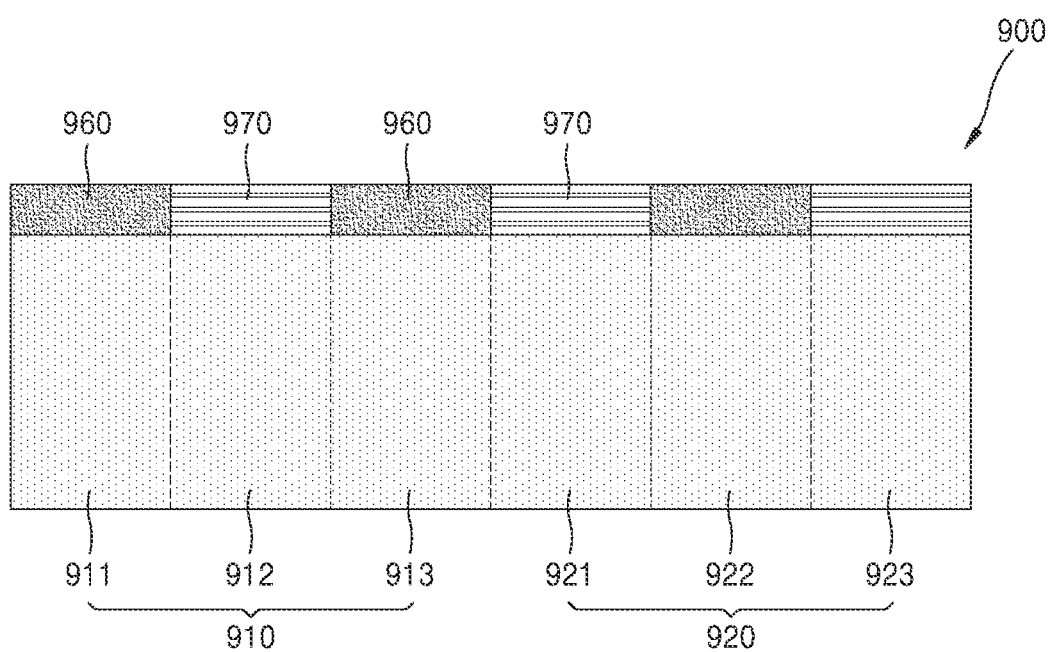
FIG. 12 is a schematic cross-sectional view of a spectral filter according to another example embodiment.

FIG. 12 is a schematic cross-sectional view of a spectral filter according to another example embodiment.

Referring to FIG. 12, a spectral filter 900 may include a first filter array 910 and a second filter array 920, and a short wavelength cut filter 960 and a long wavelength cut filter 970 provided in the first and second filter arrays 910 and 920.

The first filter array 910 may include a first unit filter 911, a second unit filter 912, and a third unit filter 913 having a center wavelength in a first wavelength region, and the second filter array 920 may include a fourth unit filter 921, a fifth unit filter 922, and a sixth unit filter 923 having a center wavelength in the second wavelength region.

The unit filter described above may be applied to the first to sixth unit filters 911, 912, 913, 921, 922, and 923 included in the first and second filter arrays 910 and 920.

The short wavelength cut filter 960 may be provided in some of the first to sixth unit filters 911, 912, 913, 921, 922, and 923, for example, the first, third and fifth unit filters 911, 913, and 922, and the long wavelength cut filter 970 may be provided in the other ones of the first to sixth unit filters 911, 912, 913, 921, 922, and 923, for example, the second, fourth, and sixth unit filters 912, 921, and 923. Although FIG. 12 shows an example where each of the short wavelength cut filter 960 and the long wavelength cut filter 970 is provided to correspond to one of the first to sixth unit filters 911, 912, 913, 921, 922, 923, embodiments are not limited thereto, and each of the short wavelength cut filter 960 and the long wavelength cut filter 970 may be provided to correspond to two or more of the first to sixth unit filters 911, 912, 913, 921, 922, and 923.

The short wavelength cut filter 960 may block light of a short wavelength such as visible light. The short wavelength cut filter 960 is formed by depositing Si, which is a material capable of absorbing visible light, on some of the first to sixth unit filters 911, 912, 913, 921, 922, and 923, for example, the first unit filter 911, the third unit filter 913, and the fifth unit filter 922. The first, third, and fifth unit filters 911, 913, and 922 provided with the short wavelength cut filter 960 may transmit near infrared (NIR) having a wavelength longer than that of visible light.

The long wavelength cut filter 970 may block light of a long wavelength such as NIR. The long wavelength cut filter 970 may include an NIR cut filter. The second, fourth, and sixth unit filters 912, 921, and 923 provided with the long wavelength cut filter 970 may transmit visible light having a wavelength shorter than a wavelength of NIR.

According to the example embodiment, by providing the short wavelength cut filter 960 and the long wavelength cut filter 970 on the first and second filter arrays 910 and 920, the spectral filter 900 may be manufactured having a broadband characteristic capable of implementing a band from a visible light band to a near-infrared band.

According to example embodiments, the spectral filter may implement a broadband characteristic by including a plurality of band filters having different reflection wavelength bands while sharing a cavity.

Figure 13:
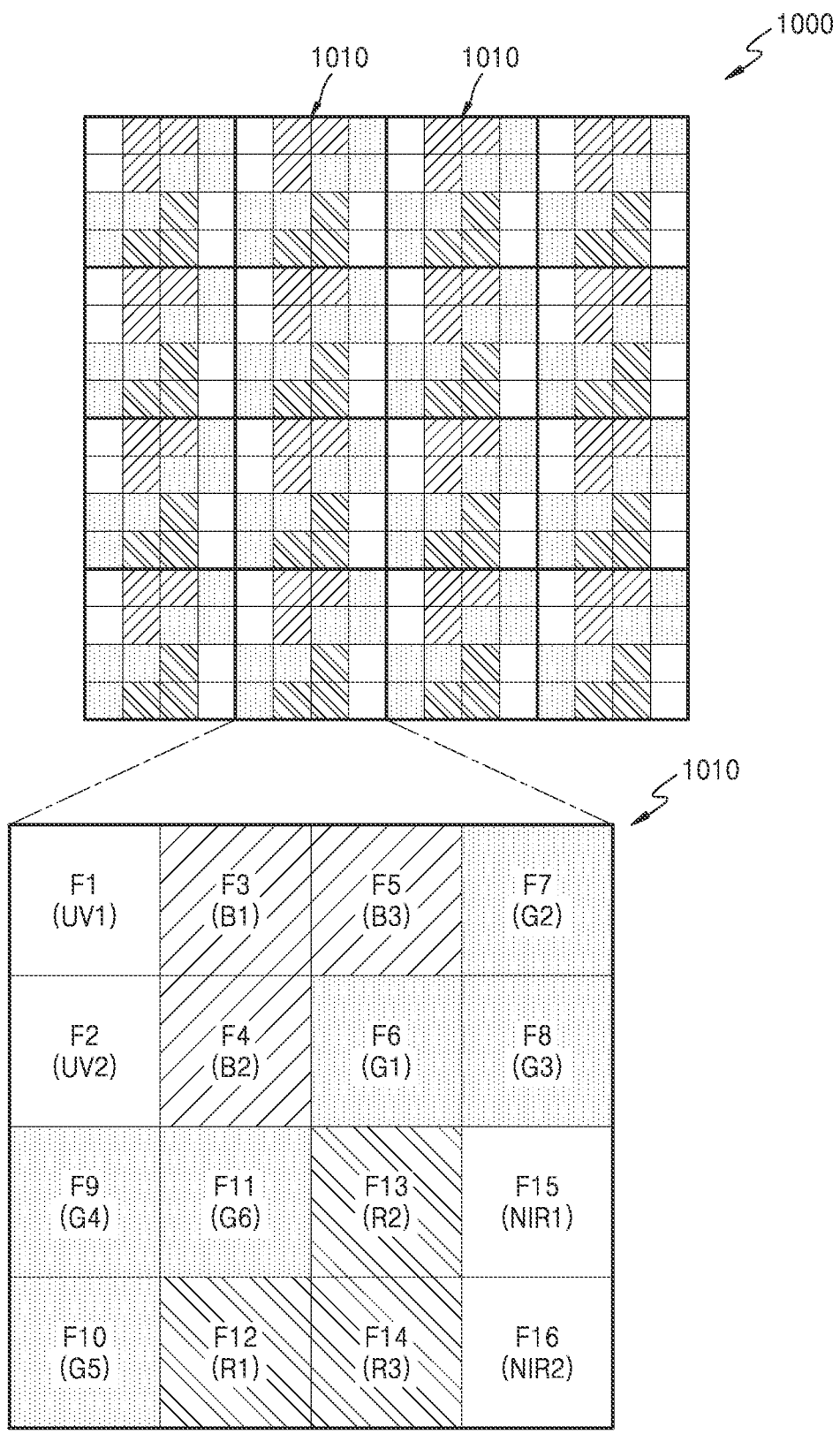
FIG. 13 is a plan view of an example of a spectral filter that is applicable to the image sensor of FIG. 1.

FIG. 13 is a plan view of an example of a spectral filter 1000 that is applicable to the image sensor 10 of FIG. 1.

Referring to FIG. 13, the spectral filter 1000 may include a plurality of filter groups 1010 arranged in two dimensions. Each of the filter groups 1010 may include sixteen unit filters F1 to F16 arranged in a 4×4 array.

The first unit filter F1 and the second unit filter F2 may have center wavelengths UV1 and UV2 in an ultraviolet range, and the third unit filter F3, the fourth unit filter F4, and the fifth unit filter F5 may have center wavelengths B1 to B3 in a blue light range. The sixth unit filter F6, the seventh unit filter F7, the eighth unit filter F8, the ninth unit filter F9, the tenth unit filter F10, and the eleventh unit filter F11 may have center wavelengths G1 to G6 in a green light range, and the twelfth unit filter F12, the thirteenth unit filter F13, and the fourteenth unit filter F14 may have center wavelengths R1 to R3 in a red light range. The fifteenth unit filter F15 and the sixteenth unit filter F16 may have center wavelengths NIR1 and NIR2 in a near infrared range.

Figure 14:
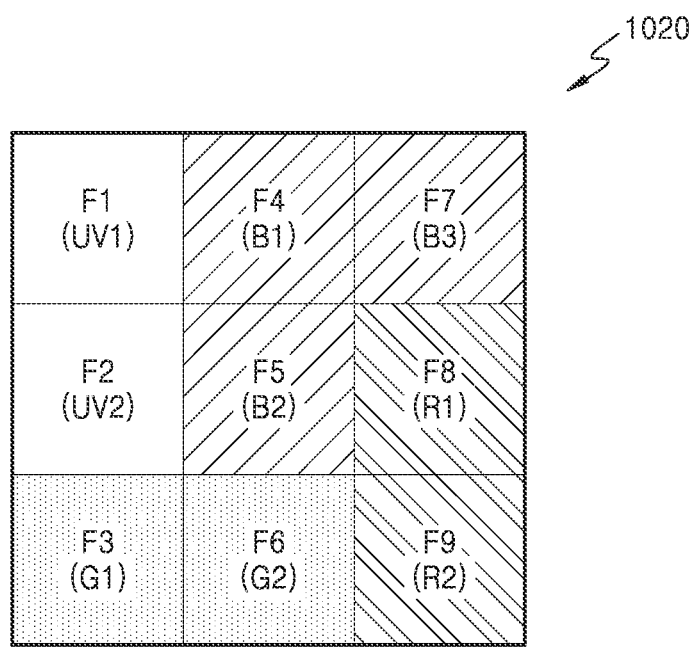
FIG. 14 is a plan view of another example of the spectral filter that is applicable to the image sensor of FIG. 1.

FIG. 14 is a plan view of another example of the spectral filter 100 that is applicable to the image sensor 10 of FIG. 1. FIG. 14 is a plan view of one filter group 9120.

Referring to FIG. 14, each filter group 1020 may include nine unit filters F1 to F9 arranged in a 3×3 array. The first unit filter F1 and the second unit filter F2 may have center wavelengths UV1 and UV2 in the ultraviolet range, and the fourth unit filter F4, the fifth unit filter F5, and the seventh unit filter F7 may have center wavelengths B1 to B3 in the blue light range. The third unit filter F3 and the sixth unit filter F6 may have center wavelengths G1 and G2 in the green light range, and the eighth unit filter F8 and the ninth unit filter F9 may have center wavelengths R1 and R2 in the red light range.

FIG. 15 is a plan view of another example of the spectral filter 1000 that is applicable to the image sensor 10 of FIG. 1. FIG. 15 is a plan view of one filter group 1030.

Referring to FIG. 15, each filter group 1030 may include twenty-five unit filters F1 to F25 arranged in a 5×5 array. The first unit filter F1, the second unit filter F2, and the third unit filter F3 may have center wavelengths UV1 to UV3 in the ultraviolet range, and the sixth unit filter F6, the seventh unit filter F7, the eighth unit filter F8, the eleventh unit filter F11, and the twelfth unit filter F12 may have center wavelengths B1 to B5 in the blue light range. The fourth unit filter F4, the fifth unit filter F5, and the ninth unit filter F9 may have center wavelengths G1 to G3 in the green light range, and the tenth unit filter F10, the thirteenth unit filter F13, the fourteenth unit filter F14, the fifteenth unit filter F15, the eighteenth unit filter F18, and the nineteenth unit filter F19 may have center wavelengths R1 to R6 in a red light range. The twentieth unit filter F20, the twenty-third unit filter F23, the twenty-fourth unit filter F24, and the twenty-fifth unit filter F25 may have center wavelengths NIR1 to NIR4 in the near infrared range.

The image sensor 10 having the above-described spectral filter may be employed in various high performance optical devices or high performance electronic devices. The electronic devices may include, for example, smart phones, mobile phones, cellular phones, personal digital assistants (PDAs), laptop computers, personal computers (PCs), various portable devices, home appliances, security cameras, medical cameras, automobiles, Internet of Things (IoT) devices, and other mobile or no-mobile computing devise, but embodiments are not limited thereto.

The electronic devices may further include, in addition to the image sensor 10, a processor for controlling an image sensor, for example, an application processor (AP), control a number of hardware or software constituent elements by driving operating systems or application programs through the processor, and perform various data processing and calculations. The processors may further include graphics processing units (GPUs) and/or image signal processors. When the processors include image signal processors, an image (or video) obtained through an image sensor may be stored and/or output using the processor.

Figure 16:
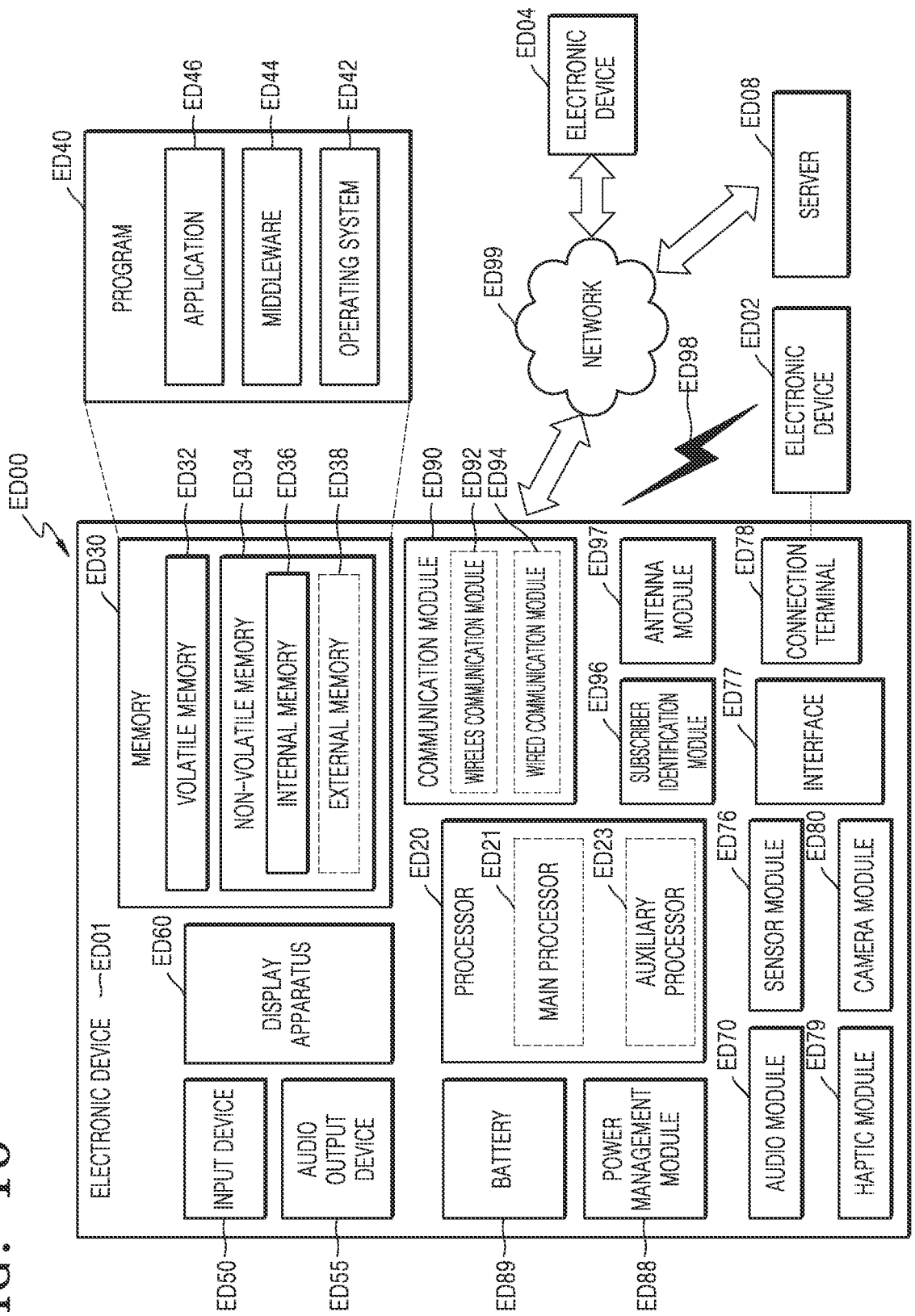
FIG. 16 is a schematic block diagram of an electronic device including an image sensor according to example embodiments.

FIG. 16 is a schematic block diagram of an electronic device ED01 including the image sensor 10, according to an example embodiment. Referring to FIG. 16, in a network environment ED00, the electronic device ED01 may communicate with another electronic device ED02 through a first network ED98 (short-range wireless communication network, and the like), or communicate with another electronic device ED04 and/or a server ED08 through a second network ED99 (long-range wireless communication network, and the like). The electronic device ED01 may communicate with the electronic device ED04 through the server ED08. The electronic device ED01 may include a processor ED20, a memory ED30, an input device ED50, an audio output device ED55, a display apparatus ED60, an audio module ED70, a sensor module ED76, an interface ED77, a haptic module ED79, a camera module ED80, a power management module ED88, a battery ED89, a communication module ED90, a subscriber identification module ED96, and/or an antenna module ED97. In the electronic device ED01, some (the display apparatus ED60, and the like) of constituent elements may be omitted or other constituent elements may be added. Some of the constituent elements may be implemented by one integrated circuit. For example, the sensor module ED76 (a fingerprint sensor, an iris sensor, an illuminance sensor, and the like) may be implemented by being embedded in the display apparatus ED60 (a display, and the like). Furthermore, when the image sensor 10 includes a spectral function, some functions (a color sensor and an illuminance sensor) of the sensor module ED76 may be implemented by the image sensor 10, not by a separate sensor module.

The processor ED20 may control one or a plurality of other constituent elements (hardware and software constituent elements, and the like) of the electronic device ED01 connected to the processor ED20 by executing software (a program ED40, and the like), and perform various data processing or calculations. As part of the data processing or calculations, the processor ED20 may load, in a volatile memory ED32, commands and/or data received from other constituent elements (the sensor module ED76, the communication module ED90, and the like), process the command and/or data stored in the volatile memory ED32, and store result data in a non-volatile memory ED34. The processor ED20 may include a main processor ED21 (a central processing unit, an application processor, and the like) and an auxiliary processor ED23 (a graphics processing unit, an image signal processor, a sensor hub processor, a communication processor, and the like) that is operable independently of or together with the main processor ED21. The auxiliary processor ED23 may use less power than the main processor ED21 and may perform a specialized function.

Instead of the main processor ED21 when the main processor ED21 is in an inactive state (sleep state), or with the main processor ED21 when the main processor ED21 is in an active state (application execution state), the auxiliary processor ED23 may control functions and/or states related to some constituent elements (the display apparatus ED60, the sensor module ED76, the communication module ED90, and the like) of the constituent elements of the electronic device ED01. The auxiliary processor ED23 (an image signal processor, a communication processor, and the like) may be implemented as a part of functionally related other constituent elements (the camera module ED80, the communication module ED90, and the like).

The memory ED30 may store various data needed by the constituent elements (the processor ED20, the sensor module ED76, and the like) of the electronic device ED01. The data may include, for example, software (the program ED40, and the like) and input data and/or output data about commands related thereto. The memory ED30 may include the volatile memory ED32 and/or the non-volatile memory ED34. The non-volatile memory ED34 may include an internal memory ED36 fixedly installed in the electronic device ED01 and an external memory ED38 that is removable.

The program ED40 may be stored in the memory ED30 as software, and may include an operating system ED42, middleware ED44, and/or an application ED46.

The input device ED50 may receive commands and/or data to be used for constituent elements (the processor ED20, and the like) of the electronic device ED01, from the outside (a user, and the like) of the electronic device ED01. The input device ED50 may include a microphone, a mouse, a keyboard, and/or a digital pen (a stylus pen, and the like).

The audio output device ED55 may output an audio signal to the outside of the electronic device ED01. The audio output device ED55 may include a speaker and/or a receiver. The speaker may be used for general purposes such as multimedia playback or recording playback, and the receiver can be used to receive incoming calls. The receiver may be implemented by being coupled as a part of the speaker or by an independent separate device.

The display apparatus ED60 may visually provide information to the outside of the electronic device ED01. The display apparatus ED60 may include a display, a hologram device, or a projector, and a control circuit to control a corresponding device. The display apparatus ED60 may include a touch circuitry set to detect a touch and/or a sensor circuit (a pressure sensor, and the like) set to measure the strength of a force generated by the touch.

The audio module ED70 may convert sound into electrical signals or reversely electrical signals into sound. The audio module ED70 may obtain sound through the input device ED50, or output sound through a speaker and/or a headphone of another electronic device (the electronic device ED02, and the like) connected to the audio output device ED55 and/or the electronic device ED01 in a wired or wireless manner.

The sensor module ED76 may detect an operation state (power, temperature, and the like) of the electronic device ED01, or an external environment state (a user state, and the like), and generate an electrical signal and/or a data value corresponding to a detected state. The sensor module ED76 may include, for example, a gesture sensor, a gyro sensor, a barometric pressure sensor, a magnetic sensor, an acceleration sensor, a grip sensor, a proximity sensor, a color sensor, an IR sensor, a biometric sensor, a temperature sensor, a humidity sensor, and/or an illuminance sensor, but embodiments are not limited thereto.

The interface ED77 may support one or a plurality of specified protocols used for the electronic device ED01 to be connected to another electronic device (the electronic device ED02, and the like) in a wired or wireless manner. The interface ED77 may include a high definition multimedia interface (HDMI), a universal serial bus (USB) interface, an SD card interface, and/or an audio interface.

A connection terminal ED78 may include a connector for the electronic device ED01 to be physically connected to another electronic device (the electronic device ED02, and the like). The connection terminal ED78 may include an HDMI connector, a USB connector, an SD card connector, and/or an audio connector (a headphone connector, and the like).

The haptic module ED79 may convert electrical signals into mechanical stimuli (vibrations, movements, and the like) or electrical stimuli that are perceivable by a user through tactile or motor sensations. The haptic module ED79 may include a motor, a piezoelectric device, and/or an electrical stimulation device.

The camera module ED80 may capture a still image and a video. The camera module ED80 may include a lens assembly including one or a plurality of lenses, the image sensor 10 of FIG. 1, image signal processors, and/or flashes. The lens assembly included in the camera module ED80 may collect light emitted from a subject for image capturing.

The power management module ED88 may manage power supplied to the electronic device ED01. The power management module ED88 may be implemented as a part of a power management integrated circuit (PMIC).

The battery ED89 may supply power to the constituent elements of the electronic device ED01. The battery ED89 may include non-rechargeable primary cells, rechargeable secondary cells, and/or fuel cells.

The communication module ED90 may establish a wired communication channel and/or a wireless communication channel between the electronic device ED01 and another electronic device (the electronic device ED02, the electronic device ED04, the server ED08, and the like), and support a communication through an established communication channel. The communication module ED90 may be operated independent of the processor ED20 (the application processor, and the like), and may include one or a plurality of communication processors supporting a wired communication and/or a wireless communication. The communication module ED90 may include a wireless communication module ED92 (a cellular communication module, a short-range wireless communication module, a global navigation satellite system (GNSS) communication module, and the like), and/or a wired communication module ED94 (a local area network (LAN) communication module, a power line communication module, and the like). Among the above communication modules, a corresponding communication module may communicate with another electronic device through the first network ED98 (a short-range communication network such as Bluetooth, WiFi Direct, or infrared data association (IrDA)) or the second network ED99 (a long-range communication network such as a cellular network, the Internet, or a computer network (LAN, WAN, and the like)). These various types of communication modules may be integrated into one constituent element (a single chip, and the like), or may be implemented as a plurality of separate constituent elements (multiple chips). The wireless communication module ED92 may verify and authenticate the electronic device ED01 in a communication network such as the first network ED98 and/or the second network ED99 by using subscriber information (an international mobile subscriber identifier (IMSI), and the like) stored in the subscriber identification module ED96.

The antenna module ED97 may transmit signals and/or power to the outside (another electronic device, and the like) or receive signals and/or power from the outside. An antenna may include an emitter formed in a conductive pattern on a substrate (a printed circuit board (PCB), and the like). The antenna module ED97 may include one or a plurality of antennas. When the antenna module ED97 includes a plurality of antennas, the communication module ED90 may select, from among the antennas, an appropriate antenna for a communication method used in a communication network such as the first network ED98 and/or the second network ED99. Signals and/or power may be transmitted or received between the communication module ED90 and another electronic device through the selected antenna. Other parts (an RFIC, and the like) than the antenna may be included as a part of the antenna module ED97.

Some of the constituent elements may be connected to each other through a communication method between peripheral devices (a bus, general purpose input and output (GPIO), a serial peripheral interface (SPI), a mobile industry processor interface (MIPI), and the like) and may mutually exchange signals (commands, data, and the like).

The command or data may be transmitted or received between the electronic device ED01 and the external electronic device ED04 through the server ED08 connected to the second network ED99. The electronic devices ED02 and ED04 may be of a type that is the same as or different from the electronic device ED01. All or a part of operations executed in the electronic device ED01 may be executed in one or a plurality of the electronic devices (ED02, ED04, and ED08). For example, when the electronic device ED01 needs to perform a function or service, the electronic device ED01 may request one or a plurality of electronic devices to perform part of the whole of the function or service, instead of performing the function or service. The one or a plurality of the electronic devices receiving the request may perform additional function or service related to the request, and transmit a result of the performance to the electronic device ED01. To this end, cloud computing, distributed computing, and/or client-server computing technology may be used.

Figure 17:
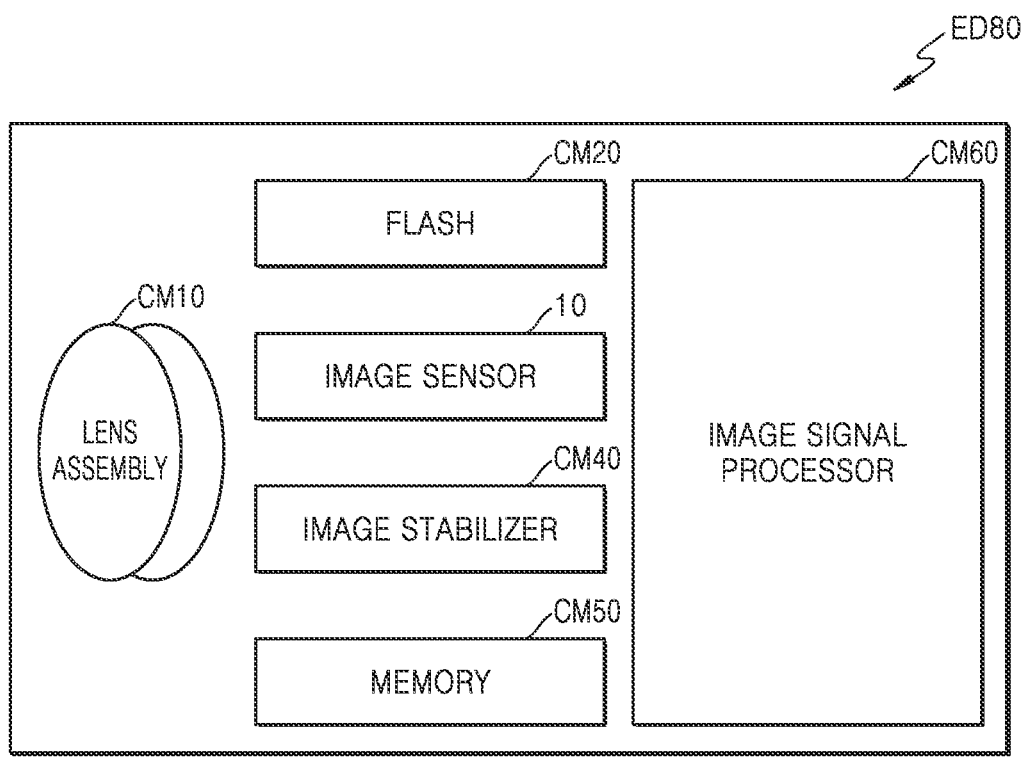
FIG. 17 is a schematic block diagram of a camera module of FIG. 16.

FIG. 17 is a schematic block diagram of the camera module ED80 of FIG. 16. Referring to FIG. 17, the camera module ED80 may include a lens assembly CM10, a flash CM20, the image sensor 10 (the image sensor 10 of FIG. 1, and the like), an image stabilizer CM40, a memory CM50 (a buffer memory, and the like), and/or an image signal processor CM60. The lens assembly CM10 may collect light emitted from a subject for image capturing. The camera module ED80 may include a plurality of lens assemblies CM10, and in this case, the camera module ED80 may include a dual camera, a 360 degrees camera, or a spherical camera. Some of the lens assemblies CM10 may have the same lens attributes (a viewing angle, a focal length, auto focus, F Number, optical zoom, and the like), or different lens attributes. The lens assembly CM10 may include a wide angle lens or a telescopic lens.

The flash CM20 may emit light used to reinforce light emitted or reflected from a subject. The flash CM20 may include one or a plurality of light-emitting diodes (a red-green-blue (RGB) LED, a white LED, an infrared LED, an ultraviolet LED, and the like), and/or a xenon lamp. The image sensor 10 may include the image sensor of FIG. 1, and convert light emitted or reflected from the subject and transmitted through the lens assembly CM10 into electrical signals, thereby obtaining an image corresponding to the subject. The image sensor 10 may include one or a plurality of sensors selected from image sensors having different attributes such as an RGB sensor, a black and white (BW) sensor, an IR sensor, or UV sensor. Each sensor included in the image sensor 10 may be implemented by a charged coupled device (CCD) sensor and/or a complementary metal oxide semiconductor (CMOS) sensor.

The image stabilizer CM40 may move, in response to a movement of the camera module ED80 or an electronic device ED01 including the same, one or a plurality of lenses included in the lens assembly CM10 or the image sensor 10 in a particular direction or may compensate a negative effect due to the movement by controlling (adjusting a read-out timing, and the like) the movement characteristics of the image sensor 10. The image stabilizer CM40 may detect a movement of the camera module ED80 or the electronic device ED01 by using a gyro sensor or an acceleration sensor arranged inside or outside the camera module ED80. The image stabilizer CM40 may be implemented in an optical form.

The memory CM50 may store a part or entire data of an image obtained through the image sensor 10 for a subsequent image processing operation. For example, when a plurality of images are obtained at high speed, only low resolution images are displayed while the obtained original data (Bayer-Patterned data, high resolution data, and the like) is stored in the memory CM50. Then, the memory CM50 may be used to transmit the original data of a selected (user selection, and the like) image to the image signal processor CM60. The memory CM50 may be incorporated into the memory ED30 of the electronic device ED01, or configured to be an independently operated separate memory.

The image signal processor CM60 may perform image processing on the image obtained through the image sensor 10 or the image data stored in the memory CM50. The image processing may include depth map generation, three-dimensional modeling, panorama generation, feature point extraction, image synthesis, and/or image compensation (noise reduction, resolution adjustment, brightness adjustment, blurring, sharpening, softening, and the like). The image signal processor CM60 may perform control (exposure time control, or read-out timing control, and the like) on constituent elements (the image sensor 10, and the like) included in the camera module ED80. The image processed by the image signal processor CM60 may be stored again in the memory CM50 for additional processing or provided to external constituent elements (the memory ED30, the display apparatus ED60, the electronic device ED02, the electronic device ED04, the server ED08, and the like) of the camera module ED80. The image signal processor CM60 may be incorporated into the processor ED20, or configured to be a separate processor operated independently of the processor ED20. When the image signal processor CM60 is configured by a separate processor from the processor ED20, the image processed by the image signal processor CM60 may undergo additional image processing by the processor ED20 and then displayed through the display apparatus ED60.

The electronic device ED01 may include a plurality of camera modules ED80 having different attributes or functions. In this case, one of the camera modules ED80 may be a wide angle camera, and another may be a telescopic camera. Similarly, one of the camera modules ED80 may be a front side camera, and another may be a rear side camera.

Figure 18:
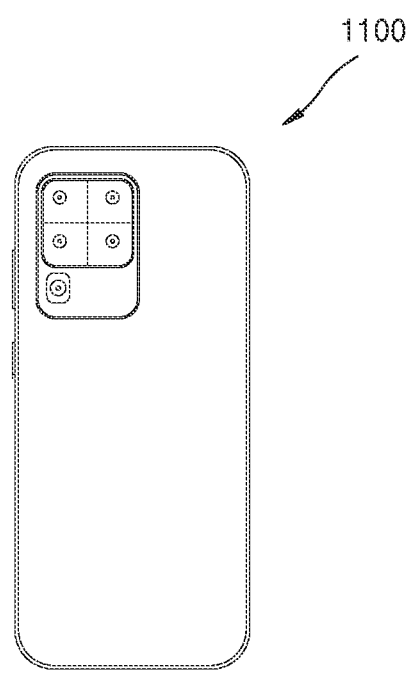
FIGS. 18, 19, 20, 21, 22, 23, 24, 25, 26, and 27 are views of various examples of electronic devices to which an image sensor is applied according to example embodiments.
Figure 19:
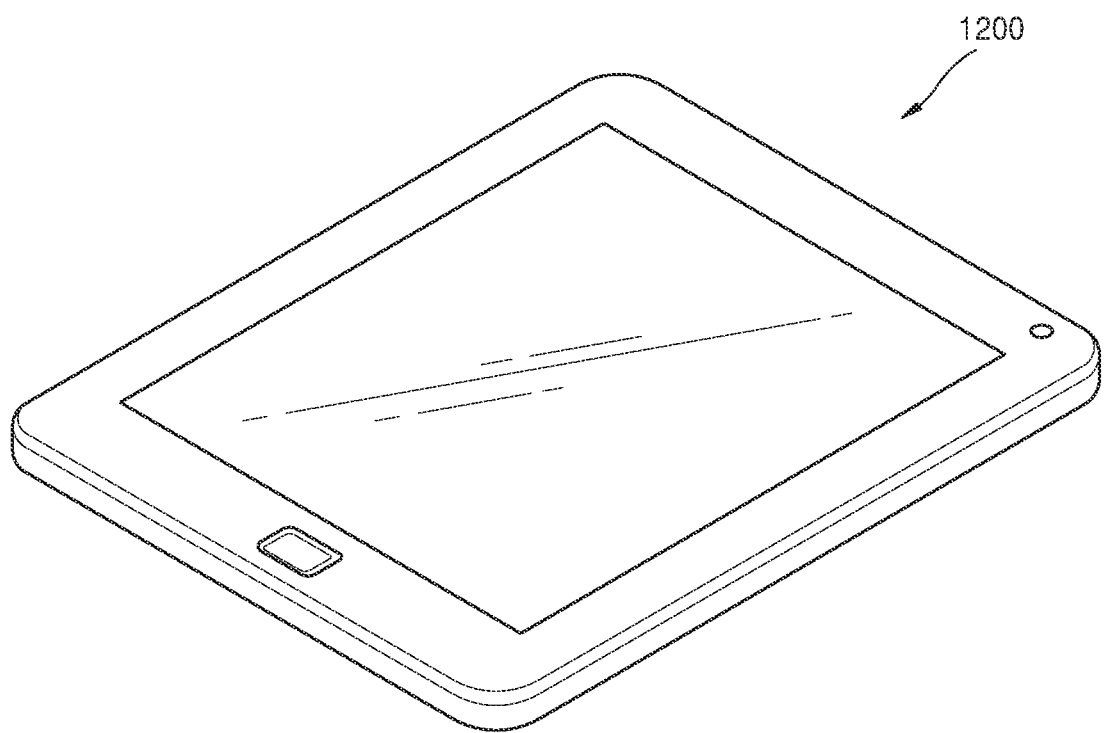
Figure 20:
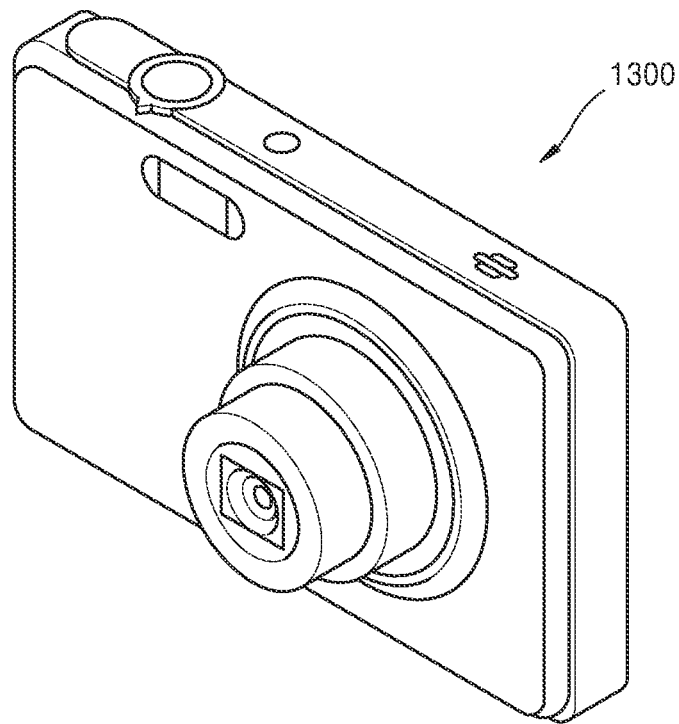
Figure 21:
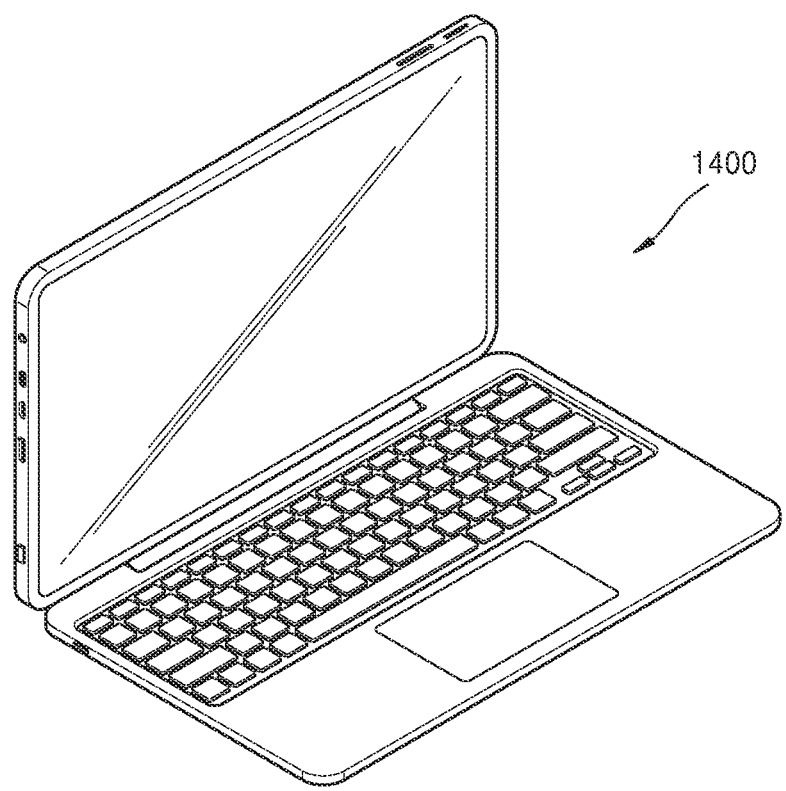
Figure 22:
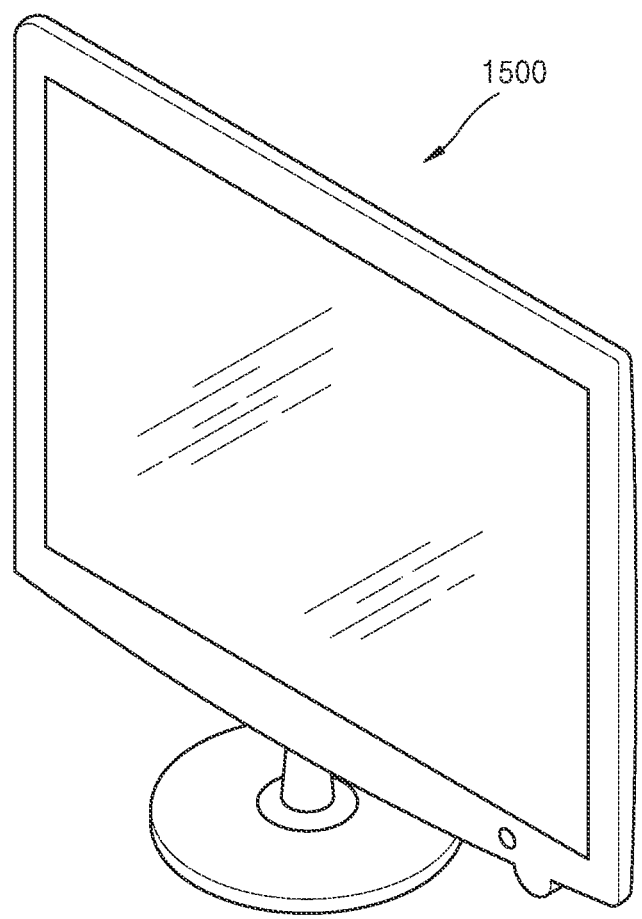

The image sensor 10 according to example embodiments may be applied to a mobile phone or smartphone 1100 illustrated in FIG. 18, a tablet or smart tablet 1200 illustrated in FIG. 19, a digital camera or camcorder 1300 illustrated in FIG. 20, a notebook computer 1400 illustrated in FIG. 21, a television or smart television 1500 illustrated in FIG. 22, and the like. For example, the smartphone 1100 or the smart tablet 1200 may include a plurality of high resolution cameras, each having a high resolution image sensor mounted thereon. Depth information of subjects in an image may be extracted by using a high resolution cameras, out focusing of the image may be adjusted, or subjects in the image may be automatically identified.

Figure 23:
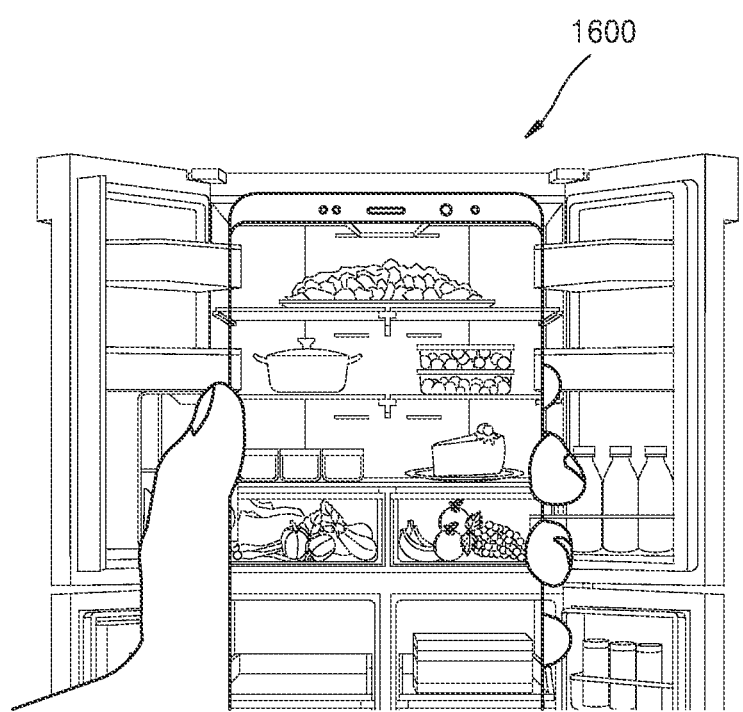
Figure 24:
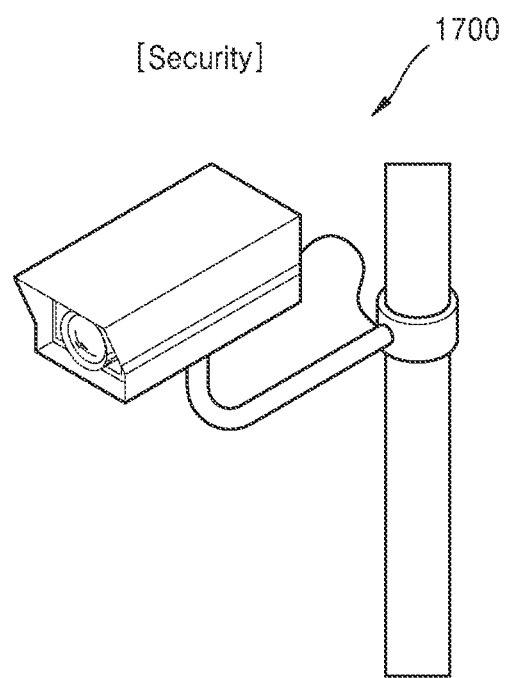
Figure 25:
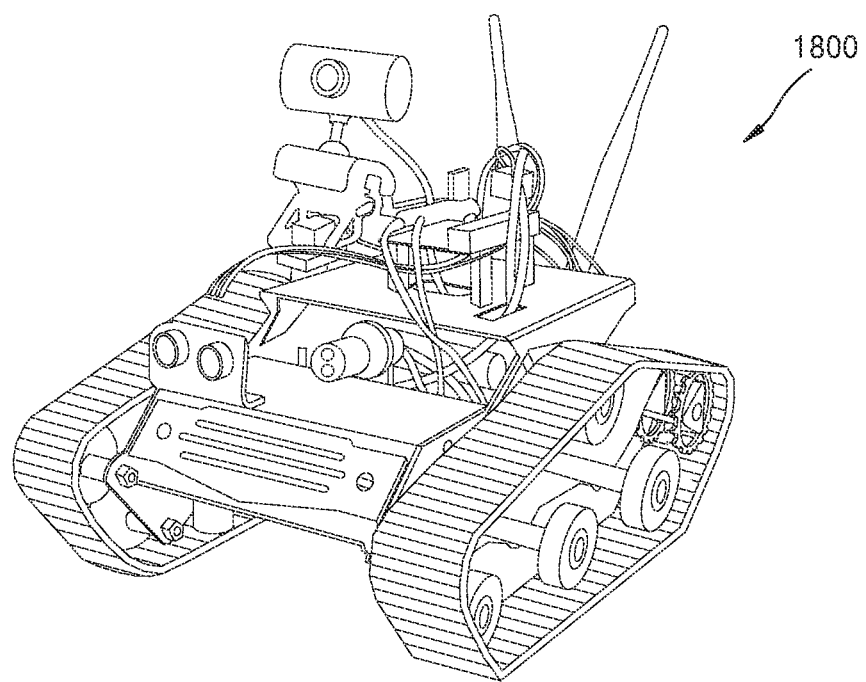
Figure 26:
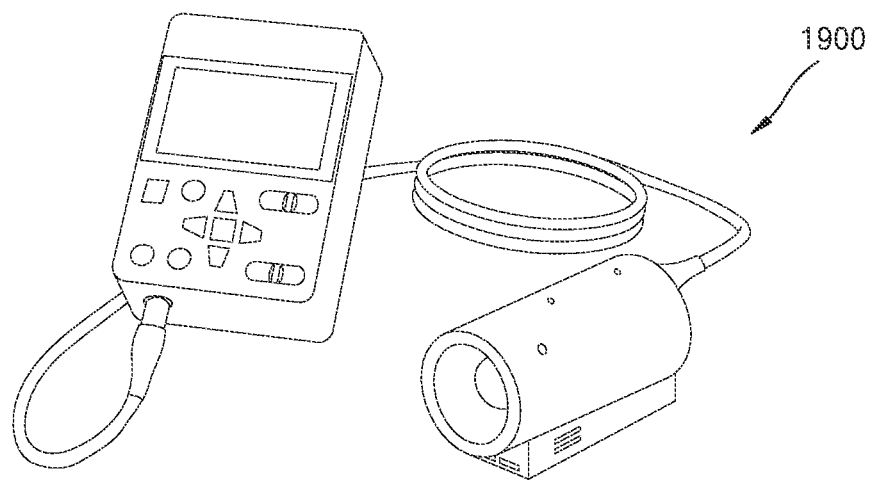

Furthermore, the image sensor 10 may be applied to a smart refrigerator 1600 illustrated in FIG. 23, a security camera 1700 illustrated in FIG. 24, a robot 1800 illustrated in FIG. 25, a medical camera 1900 illustrated in FIG. 26, and the like. For example, the smart refrigerator 1600 may automatically recognize food in a refrigerator, by using an image sensor, and notify a user of the presence of a particular food, the type of food that is input or output, and the like, through a smartphone. The security camera 1700 may provide an ultrahigh resolution image and may recognize an object or a person in an image in a dark environment by using high sensitivity. The robot 1800 may be provided in a disaster or industrial site that is not directly accessible by people, and may provide a high resolution image. The medical camera 1900 may provide a high resolution image for diagnosis or surgery, and thus a field of vision may be dynamically adjusted.

Figure 27:
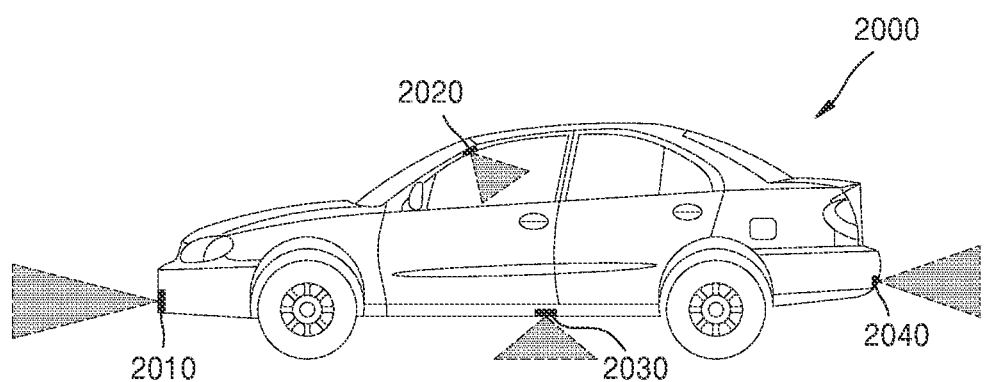

Furthermore, the image sensor 10 may be applied to a vehicle 2000 as illustrated in FIG. 27. The vehicle 2000 may include a plurality of vehicle cameras 2010, 2020, 2030, and 2040 arranged at various positions. Each of the vehicle cameras 2010, 2020, 2030, and 2040 may include an image sensor according to an example embodiment. The vehicle 2000 may provide a driver with various pieces of information about the inside or periphery of the vehicle 2000, by using the vehicle cameras 2010, 2020, 2030, and 2040, and thus an object or a person in an image may be automatically recognized and information needed for autonomous driving is provided.

It should be understood that example embodiments described herein should be considered in a descriptive sense only and not for purposes of limitation. Descriptions of features or aspects within each example embodiment should typically be considered as available for other similar features or aspects in other embodiments. While example embodiments have been described with reference to the figures, it will be understood by those of ordinary skill in the art that various changes in form and details may be made therein without departing from the spirit and scope as defined by the following claims and their equivalents.

What is claimed is:

1. A spectral filter comprising:
a first Bragg reflective layer;
a second Bragg reflective layer spaced apart from the first Bragg reflective layer;
a first resonance layer provided between the first Bragg reflective layer and the second Bragg reflective layer, the first resonance layer comprising a cavity;
a second resonance layer comprising at least a portion of the first Bragg reflective layer, the second Bragg reflective layer, and the cavity;
a third Bragg reflective layer; and
a fourth Bragg reflective layer spaced apart from the third Bragg reflective layer,
wherein the second resonance layer is provided between the third Bragg reflective layer and the fourth Bragg reflective layer, and
wherein the first Bragg reflective layer contacts the third Bragg reflective layer and the second Bragg reflective layer contacts the fourth Bragg reflective layer.

2. The spectral filter of claim 1, wherein each of the first Bragg reflective layer, the second Bragg reflective layer, the third Bragg reflective layer, and the fourth Bragg reflective layer comprises a plurality of material layers having different refractive indices that are alternately stacked.

3. The spectral filter of claim 1, wherein each of the first Bragg reflective layer, the second Bragg reflective layer, the third Bragg reflective layer, and the fourth Bragg reflective layer comprises a distributed Bragg reflector.

4. The spectral filter of claim 1, wherein the first Bragg reflective layer and the second Bragg reflective layer are symmetrical with respect to the first resonance layer.

5. The spectral filter of claim 1, wherein the third Bragg reflective layer and the fourth Bragg reflective layer are symmetrical with respect to the second resonance layer.

6. The spectral filter of claim 1, wherein a thickness of a material layer included in the first Bragg reflective layer and the second Bragg reflective layer is different from a thickness of a material layer included in the third Bragg reflective layer and the fourth Bragg reflective layer.

7. The spectral filter of claim 1, wherein a thickness of a material layer included in the first Bragg reflective layer and the second Bragg reflective layer is less than a thickness of a material layer included in the third Bragg reflective layer and the fourth Bragg reflective layer.

8. The spectral filter of claim 1, wherein the second resonance layer comprises the first Bragg reflective layer and the second Bragg reflective layer.

9. The spectral filter of claim 8, wherein a first surface of the first Bragg reflective layer and a first surface of the second Bragg reflective layer are in contact with the first resonance layer.

10. The spectral filter of claim 9, wherein a second surface of the first Bragg reflective layer opposite to the first surface of the first Bragg reflective layer and a second surface of the second Bragg reflective layer opposite to the first surface of the second Bragg reflective layer are in contact with the third Bragg reflective layer and the fourth Bragg reflective layer, respectively.

11. The spectral filter of claim 1, wherein the second resonance layer comprises one of the first Bragg reflective layer and the second Bragg reflective layer.

12. The spectral filter of claim 11, wherein one of the first Bragg reflective layer and the second Bragg reflective layer is in contact with the first resonance layer.

13. The spectral filter of claim 11, wherein the other one of the first Bragg reflective layer and the second Bragg reflective layer is spaced apart from the first resonance layer, and
wherein one of the third Bragg reflective layer and the fourth Bragg reflective layer is provided between the other of the first Bragg reflective layer and the second Bragg reflective layer and the first resonance layer.

14. The spectral filter of claim 1, wherein a wavelength of light passing through the spectral filter is determined by at least one of an effective refractive index of the cavity and a thickness of the cavity.

15. The spectral filter of claim 1, further comprising:
a first unit filter configured to transmit light of a first wavelength; and
a second unit filter configured to transmit light of a second wavelength that is different from the first wavelength.

16. The spectral filter of claim 15, wherein an effective refractive index of the cavity included in the first unit filter and an effective refractive index of the cavity included in the second unit filter are different from each other.

17. The spectral filter of claim 16, wherein a material pattern of the cavity included in the first unit filter and a material pattern of the cavity included in the second unit filter are different from each other.

18. An image sensor comprising:
a spectral filter configured to transmit light; and
a pixel array configured to receive the light transmitted through the spectral filter,
wherein the spectral filter comprises:
a first Bragg reflective layer;
a second Bragg reflective layer spaced apart from the first Bragg reflective layer;
a first resonance layer provided between the first Bragg reflective layer and the second Bragg reflective layer, the first resonance layer comprising a cavity;
a second resonance layer comprising at least a portion of the first Bragg reflective layer, the second Bragg reflective layer, and the cavity;
a third Bragg reflective layer; and
a fourth Bragg reflective layer spaced apart from the third Bragg reflective layer,
wherein the second resonance layer is provided between the third Bragg reflective layer and the fourth Bragg reflective layer, and
wherein the first Bragg reflective layer contacts the third Bragg reflective layer and the second Bragg reflective layer contacts the fourth Bragg reflective layer.

19. The image sensor of claim 18, wherein each of the first Bragg reflective layer, the second Bragg reflective layer, the third Bragg reflective layer, and the fourth Bragg reflective layer comprises a distributed Bragg reflector (DBR).

20. The image sensor of claim 18, wherein a thickness of a material layer included in the first Bragg reflective layer and the second Bragg reflective layer is different from a thickness of a material layer included in the third Bragg reflective layer and the fourth Bragg reflective layer.

21. The image sensor of claim 18, wherein the second resonance layer comprises the first Bragg reflective layer and the second Bragg reflective layer.

22. The image sensor of claim 21, wherein a first surface of the first Bragg reflective layer and a first surface of the second Bragg reflective layer are in contact with the first resonance layer, and
wherein a second surface of the first Bragg reflective layer opposite to the first surface of the first Bragg reflective layer and a second surface of the second Bragg reflective layer opposite to the first surface of the second Bragg reflective layer are in contact with the third Bragg reflective layer and the fourth Bragg reflective layer, respectively.

23. The image sensor of claim 18, wherein the second resonance layer comprises one of the first Bragg reflective layer and the second Bragg reflective layer.

24. The image sensor of claim 23, wherein one of the first Bragg reflective layer and the second Bragg reflective layer is in contact with the first resonance layer.

25. An electronic device comprising an image sensor, the image sensor comprising:
a spectral filter configured to transmit light; and
a pixel array configured to receive the light transmitted through the spectral filter,
wherein the spectral filter comprises:
a first Bragg reflective layer;
a second Bragg reflective layer spaced apart from the first Bragg reflective layer;
a first resonance layer comprising a cavity, the first resonance layer being provided between the first Bragg reflective layer and the second Bragg reflective layer;
a second resonance layer comprising at least a portion of the first Bragg reflective layer, the second Bragg reflective layer, and the cavity;
a third Bragg reflective layer; and
a fourth Bragg reflective layer spaced apart from the third Bragg reflective layer, wherein the second resonance layer is provided between the third Bragg reflective layer and the fourth Bragg reflective layer, and wherein the first Bragg reflective layer contacts the third Bragg reflective layer and the second Bragg reflective layer contacts the fourth Bragg reflective layer.

26. The electronic device of claim 25, comprising one of a mobile phone, a smartphone, a tablet, a smart tablet, a digital camera, a camcorder, a notebook computer, a television, a smart television, a smart refrigerator, a security camera, a robot, or a medical camera.

* * * * *